(12) United States Patent
Kang et al.

(10) Patent No.: US 11,832,479 B2
(45) Date of Patent: Nov. 28, 2023

(54) DISPLAY DEVICE WHICH INCLUDES AN EXPANDED DISPLAY AREA

(71) Applicant: Samsung Display Co., Ltd., Yongin-Si (KR)

(72) Inventors: Sunmi Kang, Yongin-si (KR); Sanghee Jang, Yongin-si (KR); Joohee Jeon, Yongin-si (KR); Juhoon Kang, Yongin-si (KR); Hyungkeun Park, Yongin-si (KR); Chungsock Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/474,170

(22) Filed: Sep. 14, 2021

(65) Prior Publication Data

US 2022/0285452 A1 Sep. 8, 2022

(30) Foreign Application Priority Data

Mar. 2, 2021 (KR) .................. 10-2021-0027432

(51) Int. Cl.
*H10K 59/121* (2023.01)
*G09G 3/3266* (2016.01)
*H10K 59/40* (2023.01)
*H10K 59/65* (2023.01)
*H10K 59/131* (2023.01)
*G09G 3/3233* (2016.01)

(52) U.S. Cl.
CPC ......... *H10K 59/121* (2023.02); *G09G 3/3266* (2013.01); *H10K 59/131* (2023.02); *H10K 59/40* (2023.02); *H10K 59/65* (2023.02); *G09G 3/3233* (2013.01); *G09G 2300/0452* (2013.01); *G09G 2300/0809* (2013.01); *G09G 2310/0202* (2013.01); *G09G 2310/08* (2013.01); *G09G 2340/0407* (2013.01)

(58) Field of Classification Search
CPC ..................................................... H01L 27/326
See application file for complete search history.

(56) References Cited

U.S. PATENT DOCUMENTS

| | | | |
|---|---|---|---|
| 11,016,349 B2 | 5/2021 | Kim et al. | |
| 2017/0115944 A1* | 4/2017 | Oh | ...... G06F 3/04845 |
| 2022/0208896 A1* | 6/2022 | Kwak | ...... H01L 27/3234 |

FOREIGN PATENT DOCUMENTS

| | | |
|---|---|---|
| CN | 110047897 A | 7/2019 |
| CN | 110874990 A | 3/2020 |
| CN | 111063719 A | 4/2020 |
| CN | 111710276 A | 9/2020 |
| KR | 10-2020-0050059 A | 5/2020 |

* cited by examiner

*Primary Examiner* — Gustavo Polo
(74) *Attorney, Agent, or Firm* — Innovation Counsel LLP

(57) ABSTRACT

A display device a substrate; first display elements arranged in a first area on the substrate; first pixel circuits arranged in the first area on the substrate and connected to the first display elements; second display elements arranged in a second area on the substrate; and second pixel circuits arranged in a third area on the substrate and connected to the second display elements. The second pixel circuits connected to the second display elements arranged in a column are arranged in a plurality of columns in the third area.

20 Claims, 24 Drawing Sheets

FIG. 12B

| Unit No. | Color | | | |
|---|---|---|---|---|
| | Data Line No. | | | |
| U1 | G | G | R | B |
| | 2 | 4 | 5 | 7 |
| U2 | G | G | B | R |
| | 8 | 10 | 11 | 13 |
| U3 | G | G | R | B |
| | 14 | 16 | 17 | 19 |
| U4 | G | G | B | R |
| | 20 | 22 | 23 | 25 |

FIG. 13B

| Unit No. | Color | | | |
|---|---|---|---|---|
| | Data Line No. | | | |
| U5 | G | G | B | R |
| | 2 | 4 | 5 | 7 |
| U6 | G | G | R | B |
| | 8 | 10 | 11 | 13 |
| U7 | G | G | B | R |
| | 14 | 16 | 17 | 19 |
| U8 | G | G | R | B |
| | 20 | 22 | 23 | 25 |

DISPLAY DEVICE WHICH INCLUDES AN EXPANDED DISPLAY AREA

CROSS-REFERENCE TO RELATED APPLICATION

This application is based on and claims priority under 35 U.S.C. § 119 to Korean Patent Application No. 10-2021-0027432, filed on Mar. 2, 2021, in the Korean Intellectual Property Office, the disclosure of which is incorporated by reference herein in its entirety.

BACKGROUND

1. Field

One or more embodiments relate to a display panel and a display device including the same, and more particularly, a display panel in which a display area is expanded to allow an image to be displayed even in an area in which a component that is an electronic element is arranged, and a display device including the display panel.

2. Description of the Related Art

Recently, the usage of display devices has diversified. Also, display devices have become thinner and more lightweight, and thus, the use of display devices has expanded.

As display devices are used in various ways, various methods may be used to design the shapes of the display devices. In addition, the number of functions that may be added or linked to display devices is increasing.

SUMMARY

One or more embodiments include a display panel, in which a display area is expanded to allow an image to be displayed even in an area in which an electronic component that is an electronic element is arranged, and a display device including the same. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device including a first area, a second area having a resolution lower than the first area, and a third area includes a substrate, first display elements arranged in the first area on the substrate, first pixel circuits arranged in the first area on the substrate and connected to the first display elements, second display elements arranged in the second area on the substrate, and second pixel circuits arranged in the third area on the substrate and connected to the second display elements, wherein the second pixel circuits connected to the second display elements arranged in a column are arranged in a plurality of columns of the third area.

The second pixel circuits connected to the second display elements arranged in the column may be arranged in two columns in the third area.

The second pixel circuits connected to the second display elements arranged in the column may be sequentially and alternately arranged in a left circuit column and a right circuit column, and a pair of second pixel circuits connected to a pair of second display elements adjacent to each other are arranged in a same circuit column.

The second display elements arranged in the column may include second display elements emitting light of a first color.

The second display elements arranged in the column may include second display elements emitting light of a second color and second display elements emitting light of a third color, and the second display elements emitting the light of the second color and the second display elements emitting the light of the third color may be alternately arranged in the column.

The display device may further include connection lines connecting the second display elements to the second pixel circuits.

The connection lines may include first connection lines arranged in the third area and connected to the second pixel circuits, and second connection lines arranged in the second area and connecting the first connection lines to the second display elements.

Each of the second connection lines may be connected to a pixel electrode constituting the second display element.

The display device may further include main scan lines arranged in the first area and connected to the first pixel circuits, and auxiliary scan lines arranged in the second area and connected to the second pixel circuits.

A second scan signal may be applied to one of the auxiliary scan lines at a timing when a first scan signal is applied to main scan lines of (7k+1)th rows (where k is a natural number) among the main scan lines.

The display device may further include main data lines arranged in the first area and connected to the first pixel circuits, auxiliary data lines arranged in the second area and connected to the second pixel circuits, and data connection lines arranged in the first area and connecting the main data lines to the auxiliary data lines, respectively.

According to one or more embodiments, a display device includes a substrate including a first area, a second area having a resolution lower than the first area, and a third area, first sub-pixels arranged in the first area on the substrate, first pixel circuits arranged in the first area on the substrate and connected to the first sub-pixels, second sub-pixels arranged in the second area on the substrate, and second pixel circuits arranged in the third area on the substrate and connected to the second sub-pixels, wherein the second sub-pixels include first color sub-pixels arranged in a first pixel column, and second color sub-pixels and third color sub-pixels alternately arranged in a second pixel column, second pixel circuits connected to the first color sub-pixels arranged in the first pixel column are arranged in two circuit columns of the third area, and second pixel circuits connected to the second color sub-pixels and the third color sub-pixels arranged in the second pixel column are arranged in two circuit columns of the third area.

Second pixel circuits connected to the second sub-pixels in each of the first pixel column and the second pixel column may be sequentially and alternately arranged in a left circuit column and a right circuit column, and a pair of second pixel circuits connected to a pair of second sub-pixels adjacent to each other may be arranged in a same circuit column.

The display device may further include connection lines connecting the second sub-pixels to the second pixel circuits.

The connection lines may include first connection lines arranged in the third area and connected to the second pixel circuits, and second connection lines arranged in the second area and connecting the first connection lines to the second sub-pixels.

The display device may further include main scan lines arranged in the first area and connected to the first pixel circuits, and auxiliary scan lines arranged in the second area and connected to the second pixel circuits.

A second scan signal may be applied to one of the auxiliary scan lines at a timing when a first scan signal is applied to main scan lines of (7k+1)th rows (where k is a natural number) among the main scan lines.

The display device may further include a first scan driver arranged in the third area and connected to the main scan lines and configured to apply a plurality of first scan signals to the main scan lines, and a second scan driver arranged in the third area and connected to the auxiliary scan lines and configured to apply a plurality of second scan signals to the auxiliary scan lines.

Second pixel circuits connected to second sub-pixels including a pair of first color sub-pixels in the first pixel column and a second color sub-pixel and a third color sub-pixel in the second pixel column may be connected to a same auxiliary scan line.

The display device may further include main data lines arranged in the first area and connected to the first pixel circuits, auxiliary data lines arranged in the second area and connected to the second pixel circuits, and data connection lines arranged in the first area and connecting the main data lines to the auxiliary data lines, respectively.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 12A, 12B, 13A and 13B are diagrams for explaining a scan signal and a data signal applied to a component area;

DETAILED DESCRIPTION

Figure 1:
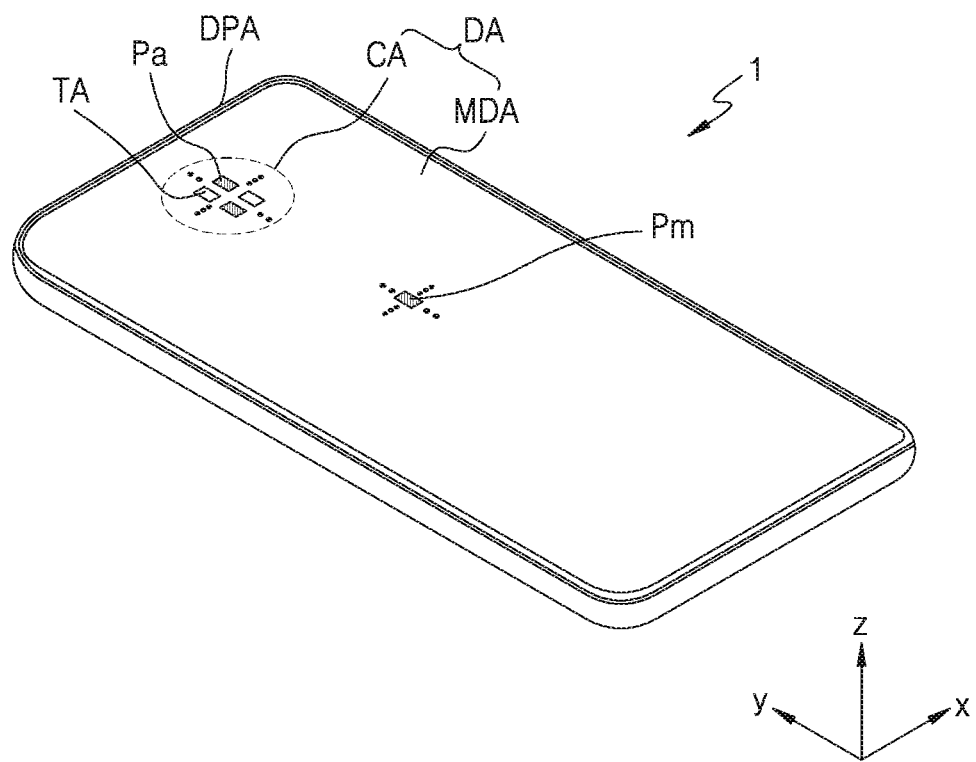
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

The embodiments of the disclosure will be described below in more detail with reference to the accompanying drawings. Those elements that are the same or are in correspondence with each other are rendered the same reference numeral regardless of the figure number, and redundant explanations are omitted.

It will be further understood that, when various elements such as a layer, film, region, or plate are referred to as being "on" another element, it can be directly or indirectly on the other element. That is, for example, intervening elements may be present therebetween.

In the following embodiments, the term "in a plan view" means seeing a target portion from above, and the term "in a cross-sectional view" means seeing a vertically cut cross-section of a target portion from side. In the following embodiments, the expression that a first element "overlaps" a second element means that the first element is above or below the second element.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic perspective view of a display device 1 according to an embodiment.

Referring to FIG. 1, the display device 1 may include a display area DA and a peripheral area DPA outside the display area DA. The display area DA includes a component area CA, which is a second area, and a main display area MDA, which is a first area surrounding at least a portion of the component area CA. That is, the component area CA and the main display area MDA may display images individually or together. The peripheral area DPA, which is a third area, may be a type of non-display area in which no display elements are arranged. The display area DA may be completely surrounded by the peripheral area DPA.

FIG. 1 illustrates that one component area CA is disposed in the display area DA. In another embodiment, the display device 1 may have two or more component areas CA, and the shapes and sizes of the two or more component areas CA may be different from each other. When viewed from a direction substantially perpendicular to the upper surface of the display device 1, the shape of the component area CA may have various shapes, for example, a circular shape, an elliptical shape, a polygonal shape such as a rectangular shape, a star shape, or a diamond shape. Although FIG. 1 illustrates that the component area CA is arranged in the upper center of the display area DA having a substantially rectangular shape, the component area CA may be arranged at one side of the rectangular display area DA, for example, on the upper right side or the upper left side of the rectangular display area DA.

The display device 1 may provide images by using a plurality of first sub-pixels Pm (or main sub-pixels) arranged in the main display area MDA and a plurality of second sub-pixels Pa (or auxiliary sub-pixels) arranged in the component area CA.

As will be described later with reference to FIGS. 2A and 2B, a component 40, which is an electronic element, may be disposed below the display panel to correspond to the component area CA. The component 40 may include an imaging element as a camera using infrared light or visible light. Alternatively, the component 40 may include a solar cell, a flash, an illumination sensor, a proximity sensor, and an iris sensor. Alternatively, the component 40 may have a sound receiving function. In order to minimize the function limitation of the component 40, the component area CA may include a transmission area TA through which light and/or sound output from the component 40 to the outside or light and/or sound traveling from the outside toward the component 40 is transmitted. In the display panel and the display device including the same according to embodiments, when light is transmitted through the component area CA, the light transmittance of the component area CA may be about 10% or more, more preferably 40% or more, 25% or more or 50% or more, 85% or more, or 90% or more.

The second (auxiliary) sub-pixels Pa may be arranged in the component area CA. The auxiliary sub-pixels Pa may emit light to provide a certain image. The image displayed in the component area CA is an auxiliary image that may have a resolution lower than that of the image displayed in the main display area MDA. That is, the component area CA includes the transmission area TA through which light and sound is transmitted. Because sub-pixels are not disposed in the transmission area TA, the number of second sub-pixels Pa that may be arranged per unit area may be less than the number of first sub-pixels Pm per unit area in the main display area MDA.

Figure 2A:
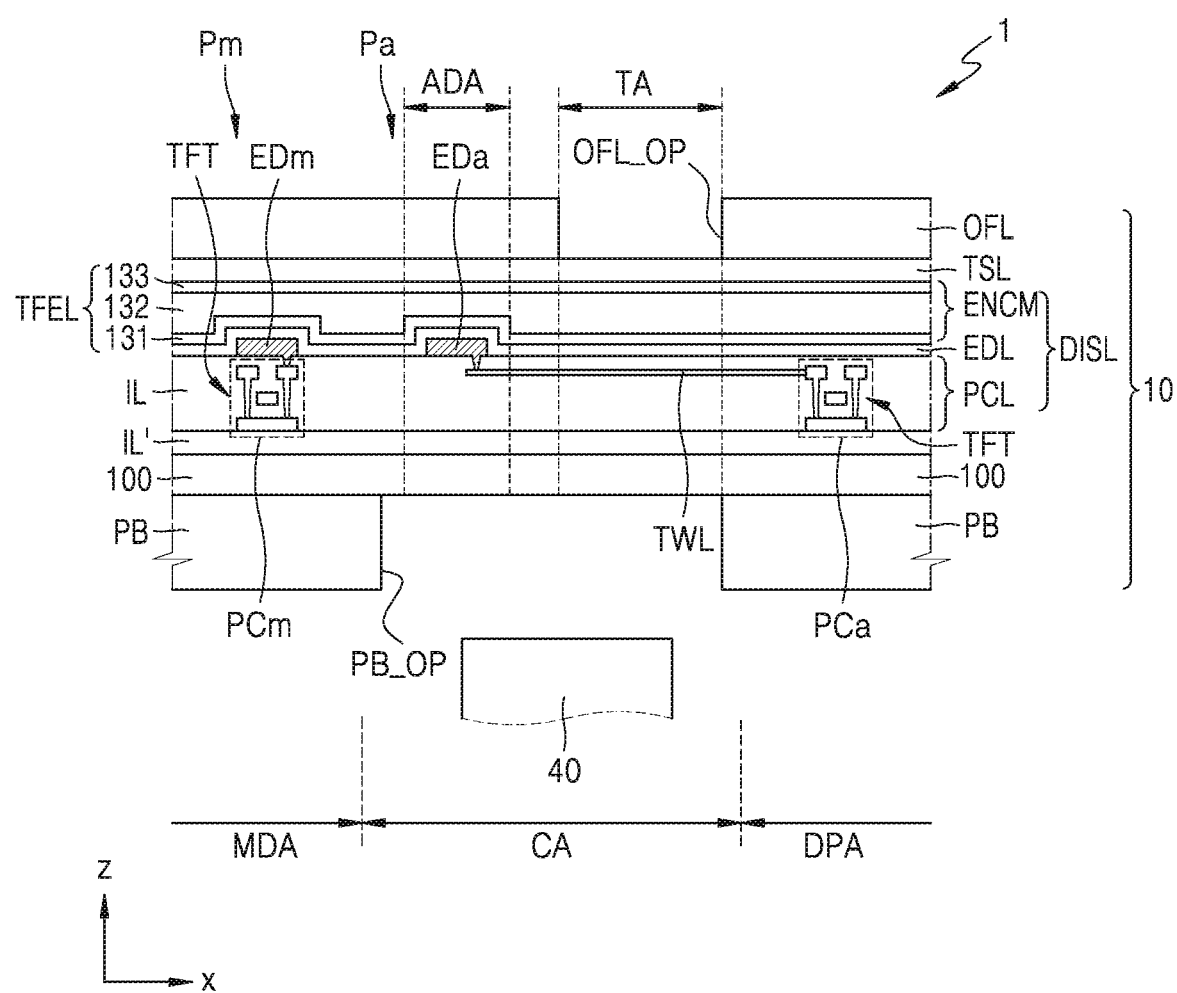
FIGS. 2A and 2B are cross-sectional views schematically illustrating a portion of a display device, according to embodiments.
Figure 2B:
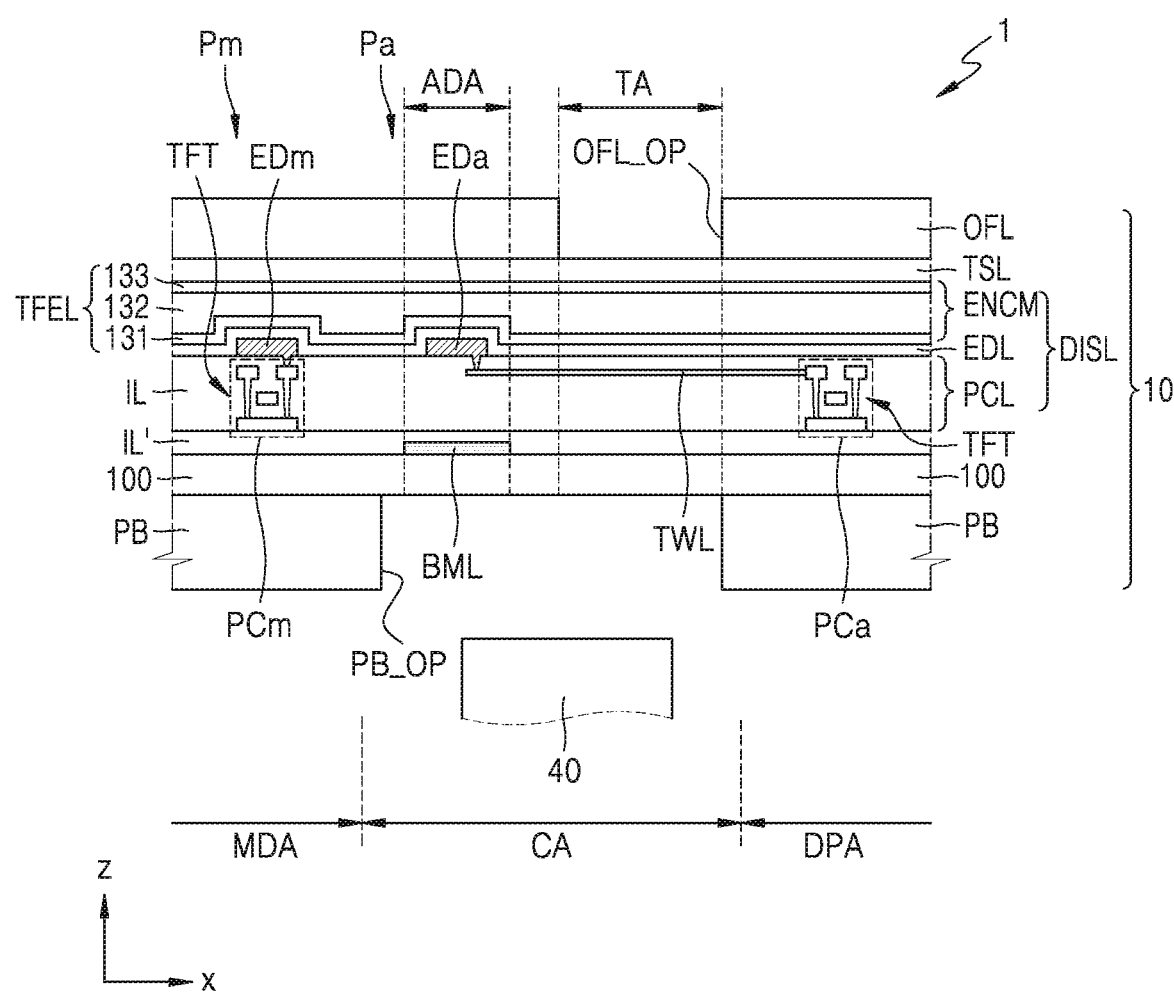

FIGS. 2A and 2B are cross-sectional views schematically illustrating a portion of a display device 1, according to embodiments.

Referring to FIG. 2A, the display device 1 may include a display panel 10 and a component 40 arranged to overlap the display panel 10. A cover window (not illustrated) that protects the display panel 10 may be further disposed on the display panel 10.

The display panel 10 includes a component area CA which overlaps the component 40, and a main display area MDA in which a main image is displayed. The display panel 10 may include a substrate 100, a display layer DISL disposed on the substrate 100, a touch screen layer TSL disposed on the display layer DISL, an optical functional layer OFL, and a panel protection member PB disposed below the substrate 100

The display layer DISL may include a circuit layer PCL including a thin-film transistor TFT, a display element layer EDL including light-emitting elements EDm and EDa as a display element, and a sealing member ENCM such as a thin-film encapsulation layer TFEL or a sealing substrate (not illustrated). Insulating layers IL and IL' may be disposed between the substrate 100 and the display element layer EDL, that is, in the display layer DISL.

A first pixel circuit PCm (or a main pixel circuit) and a first light-emitting element EDm connected thereto may be arranged in the main display area MDA of the display panel 10 to overlap each other in a plan view. The first pixel circuit PCm may include at least one thin-film transistor TFT and may control light emission of the first light-emitting element EDm. A first sub-pixel Pm may be implemented by light emission of the first light-emitting element EDm.

A second light-emitting element EDa may be arranged in the component area CA of the display panel 10 to implement a second sub-pixel Pa. In the present embodiment, a second pixel circuit PCa (or an auxiliary pixel circuit) that drives the second light-emitting element EDa is not arranged in the component area CA, but may be arranged in a peripheral area DPA, which is a non-display area. In another embodiment, the second pixel circuit PCa may be variously modified. For example, the second pixel circuit PCa may be in a portion of the main display area MDA, or may be between the main display area MDA and the component area CA. That is, the second pixel circuit PCa may be arranged not to overlap the second light-emitting element EDa.

The second pixel circuit PCa may include at least one thin-film transistor TFT and may be electrically connected to the second light-emitting element EDa by a connection line TWL. The second pixel circuit PCa may control light emission of the second light-emitting element EDa. The second sub-pixel Pa may be implemented by light emission of the second light-emitting element EDa. A region of the component area CA in which the second light-emitting element EDa is arranged may be referred to as an auxiliary display area ADA.

Also, a region of the component area CA in which the second light-emitting element EDa, which is a display element, is not arranged may be referred to as a transmission area TA. The transmission area TA may be an area through which light and/or signal emitted from the component 40 arranged to correspond to the component area CA or light and/or signal incident on the component 40 is transmitted. The auxiliary display area ADA and the transmission area TA may be alternately arranged in the component area CA. The connection line TWL connecting the second pixel circuit PCa to the second light-emitting element EDa may be arranged in the transmission area TA. Because the connection line TWL may include a transparent conductive material having high transmittance, the transmittance of the transmission area TA may be secured even when the connection line TWL is arranged in the transmission area TA.

In the present embodiment, because the second pixel circuit PCa is not arranged in the component area CA, the area of the transmission area TA may be secured and the light transmittance may be further improved.

The circuit layer PCL and the display element layer EDL may be covered with the thin-film encapsulation layer TFEL or the sealing substrate. In some embodiments, the thin-film encapsulation layer TFEL may include at least one inorganic encapsulation layer and at least one organic encapsulation layer, as illustrated in FIG. 2A. In an embodiment, the thin-film encapsulation layer TFEL may include a first inorganic encapsulation layer 131, a second inorganic encapsulation layer 133, and an organic encapsulation layer 132 disposed therebetween.

The first inorganic encapsulation layer 131 and the second inorganic encapsulation layer 133 may include at least one inorganic insulating material selected from silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and zinc oxide (ZnO). The organic encapsulation layer 132 may include a polymer-based material. The polymer-based material may include a silicone-based resin, an acrylic resin, an epoxy resin, polyimide, and polyethylene.

The first inorganic encapsulation layer 131, the organic encapsulation layer 132, and the second inorganic encapsulation layer 133 may be integrally formed to cover the main display area MDA and the component area CA.

When the sealing member ENCM is a sealing substrate (not illustrated), the sealing substrate may be arranged to face the substrate 100 with the display element disposed therebetween. A gap may exist between the sealing substrate and the display element. The sealing substrate may include glass. A sealant including a frit may be disposed between the substrate 100 and the sealing substrate, and the sealant may be disposed in the peripheral area DPA. The sealant in the peripheral area DPA may prevent infiltration of moisture through the side surface while surrounding the display area DA.

The touch screen layer TSL may obtain coordinate information according to an external input, for example, a touch event. The touch screen layer TSL may include touch electrodes and touch lines connected to the touch electrodes. The touch screen layer TSL may sense an external input by using a self-capacitance method or a mutual capacitance method.

The touch screen layer TSL may be disposed on the thin-film encapsulation layer TFEL. Alternatively, the touch screen layer TSL may be separately formed on the touch substrate and then attached to the thin-film encapsulation layer TFEL through an adhesive layer such as an optically clear adhesive (OCA). In an embodiment, the touch screen layer TSL may be directly formed on the thin-film encapsulation layer TFEL. In this case, the adhesive layer may not be disposed between the touch screen layer TSL and the thin-film encapsulation layer TFEL.

The optical functional layer OFL may include an anti-reflective layer. The anti-reflective layer may reduce the reflectance of light (external light) incident from the outside toward the display device 1.

In some embodiments, the optical functional layer OFL may include a polarizing film. The optical functional layer OFL may have an opening OFL_OP corresponding to the transmission area TA. Therefore, the light transmittance of the transmission area TA may be remarkably improved. The opening OFL_OP may be filled with a transparent material such as an optically clear resin (OCR).

In some embodiments, the optical functional layer OFL may include a filter plate including a black matrix and color filters.

In some embodiments, the optical functional layer OFL may further include a multilayer structure disposed above the anti-reflective layer. The multilayer structure may include a first layer and a second layer disposed on the first layer. The first layer and the second layer may include an organic insulating material and may have different refractive indices from each other. For example, the refractive index of the second layer may be greater than the refractive index of the first layer.

A cover window (not illustrated) may be arranged on the display panel 10 to protect the display panel 10. The optical functional layer OFL may be attached to the cover window by using an OCA, or may be attached to the touch screen layer TSL by using an OCA.

The panel protection member PB may be attached to the lower portion of the substrate 100 to support and protect the substrate 100. The panel protection member PB may have an opening PB_OP corresponding to the component area CA. Due to the opening PB_OP provided in the panel protection member PB, the light transmittance of the component area CA may be improved. The panel protection member PB may include polyethylene terephthalate (PET) or polyimide (PI).

The area of the component area CA may be greater than the area in which the component 40 is arranged. Therefore, the area of the opening PB_OP provided in the panel protection member PB may not match the area of the component area CA.

Also, a plurality of components 40 may be arranged in the component area CA. The components 40 may have different functions from each other. For example, the components 40 may include at least two selected from a camera (imaging device), a solar cell, a flash, a proximity sensor, an illuminance sensor, and an iris sensor.

As illustrated in FIG. 2B, the display device 1 according to an embodiment may include a bottom metal layer BML disposed below the second light-emitting element EDa in the component area CA. The bottom metal layer BML may be disposed between the substrate 100 and the second light-emitting element EDa to overlap the second light-emitting element EDa. The bottom metal layer BML may block external light from reaching the second light-emitting element EDa. On the other hand, the bottom metal layer BML may be formed to correspond to the entire component area CA and may include a lower hole corresponding to the transmission area TA. In this case, the lower hole may have various shapes such as a polygonal, circular, or irregular shape, and may control diffraction characteristics of external light.

Figure 3:
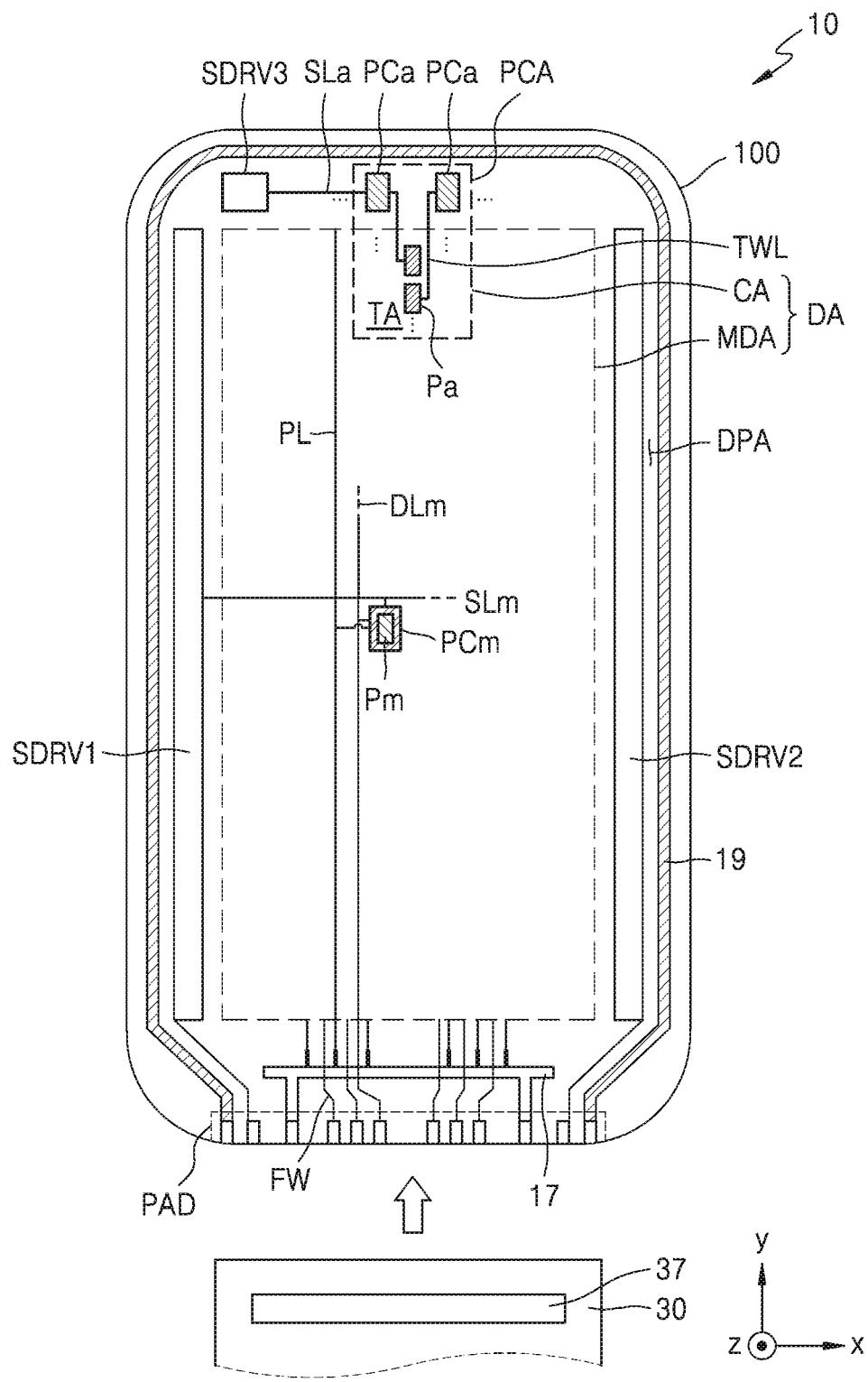
FIG. 3 is a schematic plan view of a display panel included in the display device of FIG. 1.

FIG. 3 is a schematic plan view of the display panel 10 included in the display device 1 of FIG. 1.

Referring to FIG. 3, the display panel 10 may include a display area DA and a peripheral area DPA surrounding the display area DA. The display area DA includes a main display area MDA in which a main image is displayed and a component area CA which has a transmission area TA and in which an auxiliary image is displayed. Various elements constituting the display panel 10 are disposed on the substrate 100. Therefore, it may be stated that the substrate 100 includes the display area DA including the main display area MDA and the component area CA, and the peripheral area DPA surrounding the display area DA. The auxiliary image may form one whole image together with the main image, and the auxiliary image may be independent of the main image.

A plurality of first sub-pixels Pm are arranged in the main display area MDA on the substrate 100. Each of the first sub-pixels Pm may be implemented as a display element such as an organic light-emitting diode (OLED). A first pixel circuit PCm that drives the first sub-pixel Pm may be arranged in the main display area MDA, and the first pixel circuit PCm may be arranged to overlap the first sub-pixel Pm. Each of the first sub-pixels Pm may emit, for example, red light, green light, blue light, or white light. The main display area MDA may be covered with a sealing member so as to be protected from ambient air or moisture.

As described above, the component area CA may be positioned at one side of the main display area MDA, or may be arranged inside the display area DA and surrounded by the main display area MDA. A plurality of second sub-pixels Pa are arranged in the component area CA on the substrate 100. Each of the second sub-pixels Pa may be implemented by a display element such as an organic light-emitting diode. The second pixel circuit PCa that drives the second sub-pixel Pa may be arranged in the peripheral area DPA close to the component area CA. For example, when the component area CA is disposed in an upper portion of the display area DA, the second pixel circuit PCa may be disposed in an upper side of the peripheral area DPA disposed close to the upper portion of the display area DA. The second pixel circuits PCa may be grouped and arranged in the peripheral area DPA. Hereinafter, a region of the peripheral area DPA in which the second pixel circuits PCa are arranged is referred to as a pixel circuit area PCA. The second pixel circuit PCa and the display element implementing the second sub-pixel Pa may be connected to each other by a connection line TWL extending in the y direction. The second pixel circuits PCa connected to the second sub-pixels Pa arranged along the y direction (column direction) in the component area CA may not be arranged in the same column of the second sub-pixels Pa but may be disposed in different columns of the second sub-pixels Pa. That is, at least two second pixel circuits PCa connected to the second sub-pixels Pa arranged along the column direction in the component area CA may be disposed in a same row. For example, two second pixel circuits PCa connected to the second sub-pixels Pa arranged along the column direction in the component area CA may be disposed in the same row in the pixel circuit area PCA. The peripheral area DPA can be reduced because the second pixel circuits PCa of the second sub-pixels Pa of one column are arranged in two columns of the pixel circuit area PCA disposed in the peripheral area DPA. The number of second pixel circuits PCa connected to the second sub-pixels Pa arranged in the same column in the component area CA and disposed in the same row in the pixel circuit area PCA may be three or more.

Each of the second sub-pixels Pa may emit, for example, red light, green light, blue light, or white light. The component area CA may be covered with a sealing member so as to be protected from ambient air or moisture.

On the other hand, the component area CA may have a transmission area TA. The transmission area TA may be arranged to surround the second sub-pixels Pa. Alternatively, the transmission area TA may be arranged in a grid shape with the second sub-pixels Pa.

Because the component area CA has the transmission area TA, the resolution of the component area CA may be lower than the resolution of the main display area MDA. For example, the resolution of the component area CA may be about ½, ⅜, ⅓, ¼, ⅖, ⅛, ⅑, or 1/16 of the resolution of the main display area MDA. For example, the resolution of the main display area MDA may be about 400 ppi or more, and the resolution of the component area CA may be about 200 ppi or about 100 ppi.

The first and second pixel circuits PCm and PCa that drive the first and second sub-pixels Pm and Pa may be electrically connected to external circuits arranged in the peripheral area DPA. First to third scan driving circuits SDRV1 to SDRV3, a terminal part PAD, a driving voltage supply line 17, and a common voltage supply line 19 may be arranged in the peripheral area DPA.

The first scan driving circuit SDRV1 (or first main scan driving circuit) and the second scan driving circuit SDRV2 (or second main scan driving circuit) may face each other with the main display area MDA disposed therebetween and may be positioned in the left peripheral area DPA and the right peripheral area DPA of the substrate 100, respectively. The first scan driving circuit SDRV1 and the second scan driving circuit SDRV2 may apply a first scan signal through a main scan line SLm to each of the first pixel circuits PCm that drive the first sub-pixels Pm. Some first pixel circuits PCm of the first sub-pixels Pm of the main display area MDA may be electrically connected to the first scan driving circuit SDRV1 and the others thereof may be electrically connected to the second scan driving circuit SDRV2.

The third scan driving circuit SDRV3 (or auxiliary scan driving circuit) may be arranged adjacent to the pixel circuit area PCA, and may be positioned on the left or right of the upper peripheral area DPA of the substrate 100. The second pixel circuits PCa of the second sub-pixels Pa may be electrically connected to the third scan driving circuit SDRV3. The third scan driving circuit SDRV3 may apply a second scan signal through an auxiliary scan line SLa to each of the second pixel circuits PCa that drive the second sub-pixels Pa of the component area CA.

When the second pixel circuit PCa is driven by the scan driving circuit that drives the first pixel circuit PCm by using a scan line branched from the main scan line, load deviation of the scan signal may occur, causing luminance deviation between areas. According to an embodiment, the scan driving circuit that drives the first pixel circuit PCm and the scan driving circuit that drives the second pixel circuit PCa are provided independently, and the main scan line and the auxiliary scan line are also provided independently. Therefore, the first pixel circuit PCm and the second pixel circuit PCa may be driven independently. Accordingly, the load deviation of the scan signal may be minimized to improve image quality of the main display area MDA and the component area CA.

The terminal part PAD may be arranged at one side of the substrate 100. The terminal part PAD is exposed by being not covered with an insulating layer and is connected to a display circuit board 30. A display driver 37 may be arranged on the display circuit board 30.

The display driver 37 may generate a control signal to be transmitted to the first to third scan driving circuits SDRV1 to SDRV3. The display driver 37 may generate a data signal. The generated data signal may be transmitted to the first pixel circuits PCm and the second pixel circuits PCa through a fan-out line FW, a main data line DLm connected to the fan-out line FW, and an auxiliary data line connected to the main data line DLm.

The display driver 37 may supply a driving voltage ELVDD to a driving voltage supply line 17 and may supply a common voltage ELVSS to a common voltage supply line 19. The driving voltage ELVDD may be applied to the first and second pixel circuits PCm and PCa of the first and second sub-pixels Pm and Pa through a driving voltage line PL connected to the driving voltage supply line 17, and the common voltage ELVSS may be applied to the common voltage supply line 19 that is connected to opposite electrodes of display elements.

The driving voltage supply line 17 may extend along the x direction (a row direction) and be disposed adjacent to the lower side of the main display area MDA. The common voltage supply line 19 may have a loop shape in which one side is open and may partially surround the main display area MDA.

Although FIG. 3 illustrates a case in which one component area CA is provided, a plurality of component areas CA may be provided. In this case, the component areas CA may be spaced apart from each other. A first camera may be arranged to correspond to one component area CA and a second camera may be arranged to correspond to another component area CA. Alternatively, a camera may be arranged to correspond to one component area CA and an infrared sensor may be arranged to correspond to another component area CA. The component areas CA may have different shapes and sizes from each other.

The component area CA may be provided in a circular, elliptical, polygonal, or irregular shape. In some embodiments, the component area CA may have an octagonal shape. The component area CA may be provided in a polygonal shape such as a rectangle or a hexagon. The component area CA may be surrounded by the main display area MDA.

Figure 4A:
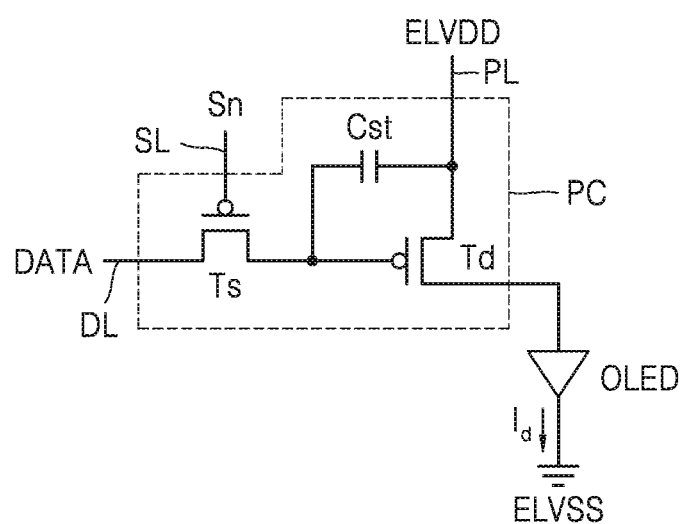
FIGS. 4A and 4B are equivalent circuit diagrams of pixel circuits that drive first and second sub-pixels, respectively.
Figure 4B:
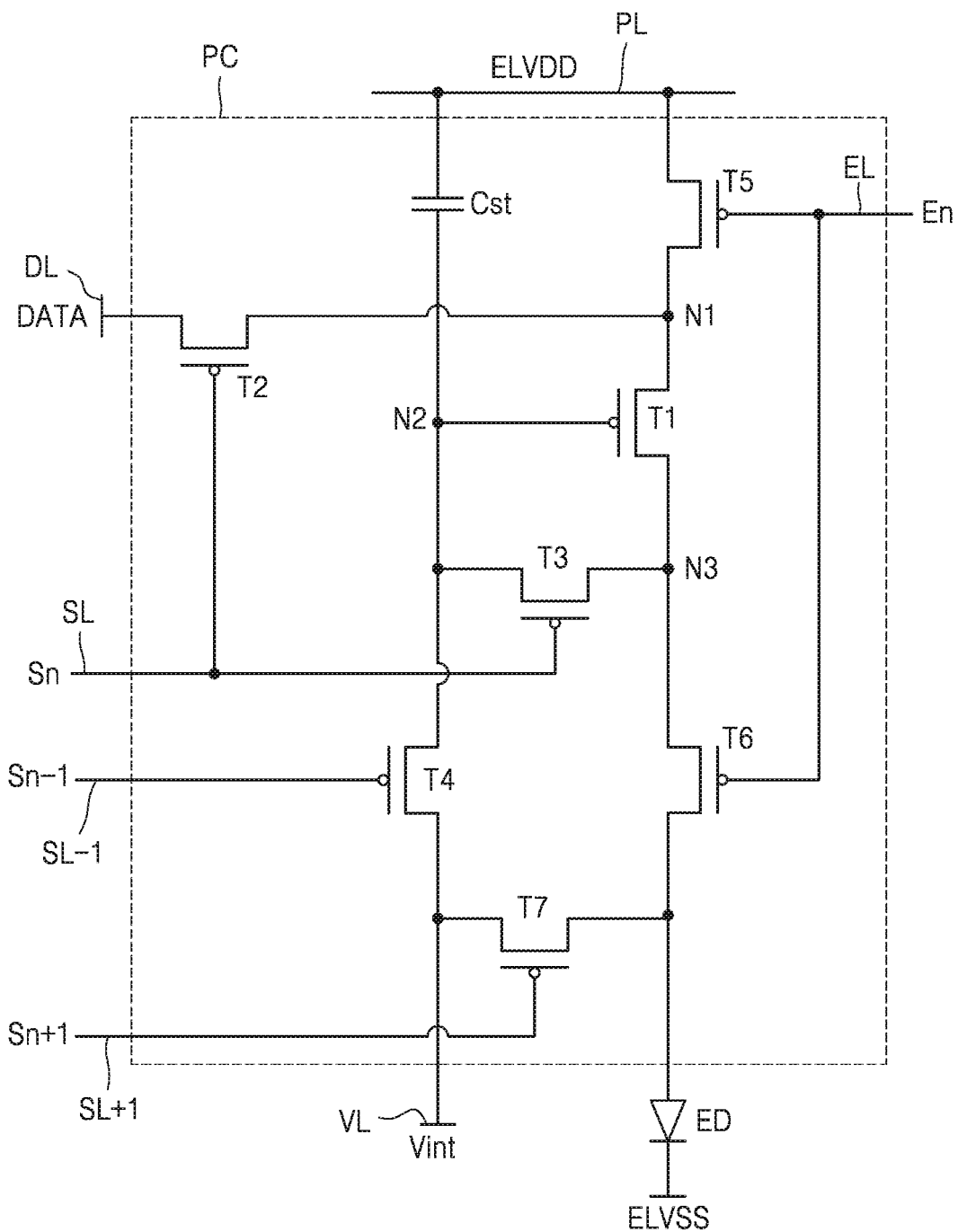

FIGS. 4A and 4B are equivalent circuit diagrams of pixel circuits that drive first and second sub-pixels Pm and Pa. FIGS. 4A and 4B may illustrate a first pixel circuit PCm that drives a first sub-pixel Pm and a second pixel circuit PCa that drives a second sub-pixel Pa. Hereinafter, for convenience of description, the first pixel circuit PCm and the second pixel circuit PCa are referred to as a pixel circuit PC.

Referring to FIG. 4A, the pixel circuit PC may be connected to a light-emitting element to implement light emission of sub-pixels. The light-emitting element may include an organic light-emitting diode OLED. The pixel circuit PC includes a driving transistor T1, a switching transistor T2, and a capacitor Cst. The switching transistor T2 may be connected to a scan line SL and a data line DL and configured to transmit, to the driving transistor T1, a data signal DATA input through the data line DL in response to a scan signal Sn input through the scan line SL.

The capacitor Cst may be connected to the switching transistor T2 and a driving voltage line PL and configured to store a voltage corresponding to a difference between a voltage received from the switching transistor T2 and a driving voltage ELVDD supplied to the driving voltage line PL.

The driving transistor T1 may be connected between the driving voltage line PL and the organic light-emitting diode OLED and configured to control a driving current flowing from the driving voltage line PL to the organic light-emitting diode OLED in response to a voltage value stored in the capacitor Cst. The organic light-emitting diode OLED may emit light having a certain luminance according to the driving current.

Although a case in which the pixel circuit PC includes two thin-film transistors and one capacitor has been described with reference to FIG. 4A, the disclosure is not limited thereto.

Referring to FIG. 4B, the pixel circuit PC includes first to seventh transistors T1 to T7. Depending on the type (p-type or n-type) of transistor and the operation conditions, a first terminal of each of the first to seventh transistors T1 to T7 may be a source terminal or a drain terminal, and a second terminal thereof may be a terminal different from the first terminal. For example, when the first terminal is a source terminal the second terminal may be a drain terminal.

The pixel circuit PC may be connected to a first scan line SL configured to transmit a scan signal Sn, a second scan line SL−1 configured to transmit a previous scan signal Sn−1, a third scan line SL+1 configured to transmit a next scan signal Sn+1, an emission control line EL configured to transmit an emission control signal En, a data line DL configured to transmit a data signal DATA, a driving voltage line PL configured to transmit a driving voltage ELVDD, and an initialization voltage line VL configured to transmit an initialization voltage Vint.

The first transistor T1 includes a gate terminal connected to a second node N2, a first terminal connected to a first node N1, and a second terminal connected to a third node N3. The first transistor T1 (driving transistor) may receive a data signal DATA according to the switching operation of the second transistor T2 and supply a driving current to a light-emitting element. The light-emitting element may include an organic light-emitting diode OLED.

The second transistor T2 (data writing transistor) includes a gate terminal connected to the first scan line SL, a first terminal connected to the data line DL, and a second terminal connected to the first node N1 (or the first terminal of the first transistor T1). The second transistor T2 may be turned on in response to the scan signal Sn received through the first scan line SL and perform a switching operation to transmit the data signal DATA supplied through the data line DL to the first node N1.

The third transistor T3 (compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on in response to the scan signal Sn received through the first scan line SL, and diode-connects the first transistor T1 to compensate for the threshold voltage of the first transistor T1. The third transistor T3 may have a structure in which two or more transistors are connected in series.

The fourth transistor T4 (first initialization transistor) includes a gate terminal connected to the second scan line SL−1, a first terminal connected to the second node N2, and a second terminal connected to the initialization voltage line VL. The fourth transistor T4 may be turned on in response to the previous scan signal Sn−1 received through the second scan line SL−1, and transmit the initialization voltage Vint to the gate terminal of the first transistor T1 so that the gate voltage of the transistor T1 is initialized. The fourth transistor T4 may have a structure in which two or more transistors are connected in series.

The fifth transistor T5 (first emission control transistor) includes a gate terminal connected to the emission control line EL, a first terminal connected to the driving voltage line PL, and a second terminal connected to the first node N1. The sixth transistor T6 (second emission control transistor) includes a gate terminal connected to the emission control line EL, a first terminal connected to the third node N3, and a second terminal connected to a pixel electrode of the organic light-emitting diode OLED. The fifth transistor T5 and the sixth transistor T6 are simultaneously turned on in response to the emission control signal En received through the emission control line EL so that a driving current flows through the organic light-emitting diode OLED.

The seventh transistor T7 (second initialization transistor) include a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on in response to the next scan signal Sn+1 received through the third scan line SL+1, and transmit the initialization voltage Vint to the pixel electrode of the organic light-emitting diode OLED so that the voltage of the pixel electrode of the organic light-emitting diode OLED is initialized. The seventh transistor T7 may be omitted.

The capacitor Cst includes a first electrode connected to the second node N2 and a second electrode connected to the driving voltage line PL.

The organic light-emitting diode OLED includes a pixel electrode and an opposite electrode facing the pixel electrode, and the opposite electrode may receive the common voltage ELVSS. The organic light-emitting diode OLED may display an image by receiving the driving current from the first transistor T1 and emitting light of a certain color. The opposite electrode may be commonly (i.e., integrally) provided in a plurality of sub-pixels.

Although FIG. 4B illustrates a case in which the fourth transistor T4 and the seventh transistor T7 are connected to the second scan line SL−1 and the third scan line SL+1, respectively, the disclosure is not limited thereto. In another embodiment, both the fourth transistor T4 and the seventh transistor T7 may be connected to the first scan line SL−1 and driven in response to the previous scan signal Sn−1.

The pixel circuits that drive the first sub-pixel Pm and the second sub-pixel Pa may be provided identically to or differently from each other. For example, the pixel circuit that drives the first sub-pixel Pm and the pixel circuit that drives the second sub-pixel Pa may each be provided with the pixel circuit illustrated in FIG. 4B. In another embodiment, the pixel circuit that drives the first sub-pixel Pm may employ the pixel circuit illustrated in FIG. 4A, and the pixel circuit that drives the second sub-pixel Pa may employ the pixel circuit illustrated in FIG. 4B.

The sub-pixel as used herein may define an emission area that emits light by a display element as a minimum unit for implementing an image. On the other hand, when an organic light-emitting diode is used as a display element, the emission area may be defined by an opening of a pixel defining layer. This will be described later.

In this specification, the first pixel circuit PCm refers to a unit of a pixel circuit that drives one first sub-pixel Pm, and the second pixel circuit PCa refers to a unit of a pixel circuit that drives one second sub-pixel Pa.

Figure 5:
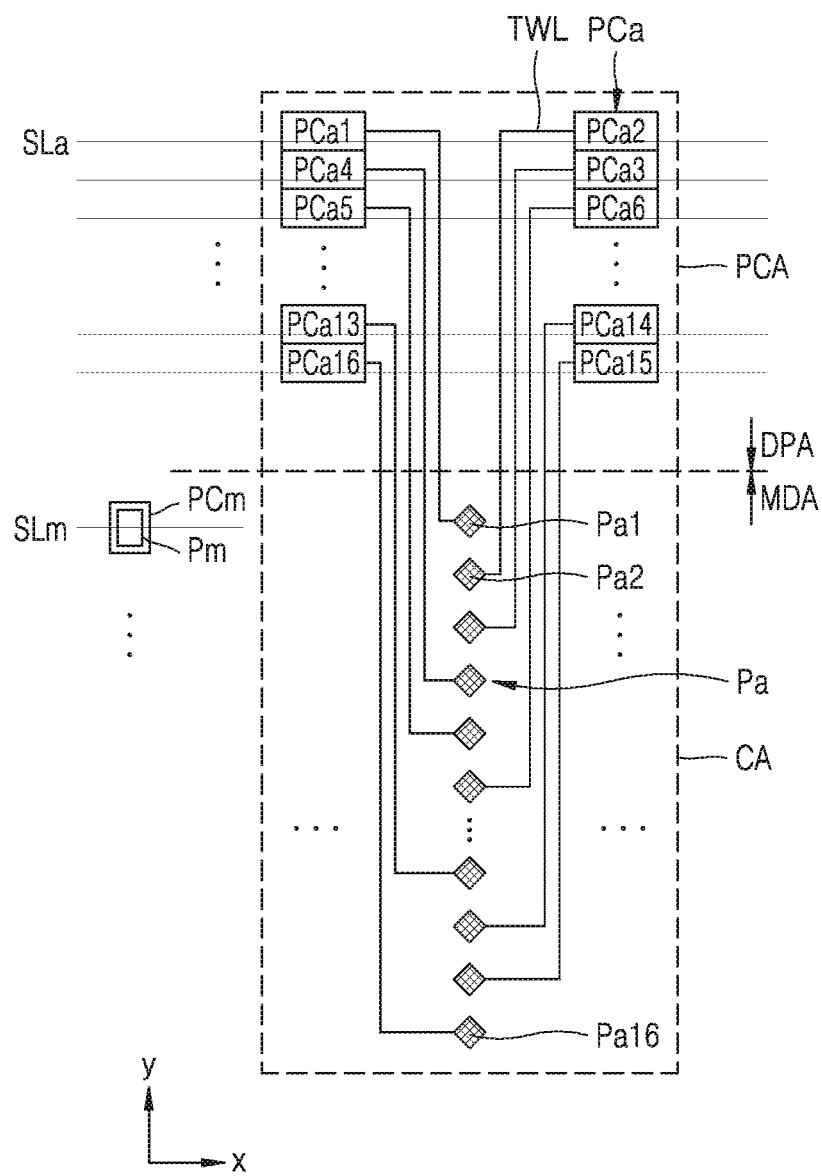
FIG. 5 is a diagram illustrating an arrangement and connection between a second sub-pixel in a component area and a second pixel circuit in a peripheral area according to an embodiment.

FIG. 5 is a diagram illustrating an arrangement and connection between a second sub-pixel in a component area and a second pixel circuit in a peripheral area according to an embodiment.

Referring to FIG. 5, a plurality of first sub-pixels Pm may be arranged in a main display area MDA. In the main display area MDA, first pixel circuits PCm may be arranged to overlap the first sub-pixels Pm, respectively, and the first pixel circuits PCm may be arranged in a matrix form in the x and y directions.

The second sub-pixels Pa may be arranged in the component area CA. The second sub-pixels Pa may be arranged in the component area CA in various shapes. Some second sub-pixels Pa may form a pixel group. In the pixel group, the second sub-pixels Pa may be arranged in various shapes such as a pentile structure, a stripe structure, a mosaic arrangement structure, and a delta arrangement structure. The second pixel circuits PCa that control light emission of the second sub-pixels Pa may be arranged in the pixel circuit area PCA in the peripheral area DPA.

The second pixel circuits PCa may be connected to the second sub-pixels Pa by connection lines TWL, respectively. The number of second pixel circuits PCa disposed in one column of the second pixel circuits PCa is less than the number of second sub-pixels Pa in one column of the second sub-pixels Pa. The second pixel circuits PCa connected to the one column of the second sub-pixels Pa may be arranged in a plurality of columns of the second pixel circuits PCa. For example, as illustrated in FIG. 5, when 16 second sub-pixels Pa1 to Pa16 are arranged in the component area CA in the one column, the second pixel circuits PCa are arranged in the pixel circuit area PCA in two columns. Eight second pixel circuits PCa may be arranged in each column. The second pixel circuits PCa of two columns may be spaced apart from each other while facing each other.

When the scan signal is applied to the second sub-pixels Pa1 to Pa16 along the −y direction, the second pixel circuits PCa1 to PCa16 connected to the second sub-pixels Pa1 to Pa16, that is, the first second sub-pixel Pa1 to the last second sub-pixel Pa16, may be arranged in the pixel circuit area PCA in two or more columns. For example, the second pixel circuits Pca1 to PCa16 connected to the second sub-pixels Pa1 to Pa16, that is, the first second sub-pixel Pa1 to the last second sub-pixel Pa16, may be alternately and sequentially arranged in the pixel circuit area PCA in two columns, the left column and the right column. Second pixel circuits connected to the second sub-pixels Pa1 to Pa16 adjacent to each other along the column direction may be disposed in a same row of the second pixel circuits Pca1 to PCa16 so that pairs of adjacent second sub-pixels Pa1 and Pa2, Pa3 and Pa4, Pa5 and Pa6, . . . , and Pa15 and Pa16 are simultaneously selected by the scan signal to emit light at the same time. Also, the second pixel circuits Pca1 to PCa16 may be arranged so that the connection lines TWL connecting the second sub-pixels Pa1 to Pa16 to the second pixel circuits Pca1 to PCa16, respective, do not cross each other. Accordingly, from the second second sub-pixel Pa2, pairs of second pixel circuits PCa2 and PCa3, PCa4 and PCa5, . . . , and PCA14 and PCa15 connected to the pairs of adjacent second sub-pixels Pa2 and Pa3, Pa4 and Pa5, . . . , and Pa14 and Pa15 may be arranged adjacent to the same column.

According to an embodiment, the second pixel circuits Pca1 to PCa16 connected to the second sub-pixels Pa1 to Pa16 may be sequentially arranged in the order of left, right, right, left, left, right, right, . . . . That is, the second pixel circuits PCa1, PCa4, PCa5, . . . , PCa13, and PCa16 may be arranged in the left column of the pixel circuit area PCA, and the second pixel circuits PCa2, PCa3, PCa6, . . . , PCa14, and PCa15 may be arranged in the right column.

According to another embodiment, the second pixel circuits Pca1 to PCa16 respectively connected to the second sub-pixels Pa1 to Pa16 may be sequentially arranged in the order of right, left, left right, right, left, left, . . . . That is, the second pixel circuits PCa1, PCa4, PCa5, . . . , PCa13, and PCa16 may be arranged in the right column of the pixel circuit area PCA, and the second pixel circuits PCa2, PCa3, PCa6, . . . , PCa14, and PCa15 may be arranged in the left column.

In an embodiment, the second sub-pixels Pa arranged in a line may be sub-pixels that emit light of the same color. In another embodiment, the second sub-pixels Pa arranged in a line may be sub-pixels that emit light of different colors from each other, and the sub-pixels that emit light of different colors from each other may be alternately arranged in one column.

According to an embodiment, a dead space may be reduced compared with a case in which the second pixel circuits PCa connected to the second sub-pixels Pa of one column are arranged in one column in the y direction.

Figure 6:
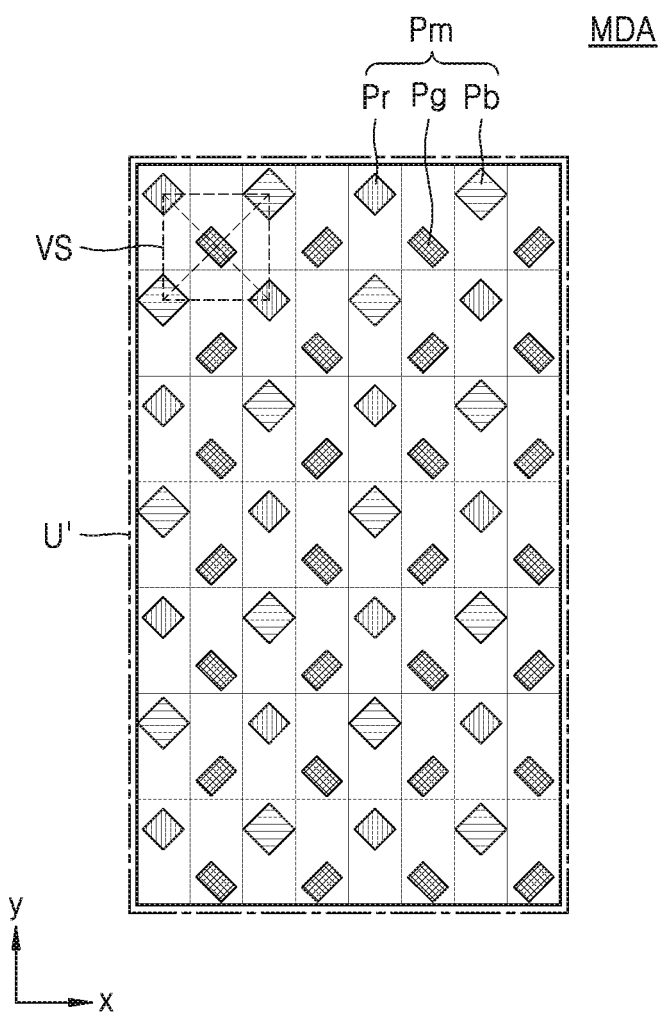
FIG. 6 is a layout diagram schematically illustrating an arrangement of sub-pixels in a main display area according to an embodiment.

FIG. 6 is a layout diagram schematically illustrating an arrangement of sub-pixels in a main display area according to an embodiment.

Referring to FIG. 6, the first sub-pixels Pm in the main display area MDA may include a plurality of colored sub-pixels, for example, a first red sub-pixel Pr, a first green sub-pixel Pg, and a first blue sub-pixel Pb. The first red sub-pixel Pr, the first green sub-pixel Pg, and the first blue sub-pixel Pb may implement red light, green light, and blue light, respectively.

The first sub-pixels Pm may be arranged in a pentile structure. For example, the first red sub-pixels Pr are arranged at first and third vertices facing each other among the vertices of a virtual quadrangle VS having the first green sub-pixel Pg disposed at the center of the virtual quadrangle VS, and the first blue sub-pixels Pb are arranged at the remaining second and fourth vertices of the virtual quadrangle VS. In this case, the virtual quadrangle VS may be variously modified into, for example, a rectangle, a rhombus, a square, and the like. The size of the first green sub-pixel Pg may be less than the size of the first red sub-pixel Pr and the first blue sub-pixel Pb.

Such a pixel arrangement structure is referred to as a pentile matrix structure or a pentile structure. By applying a rendering drive that expresses colors by sharing adjacent pixels, high resolution may be implemented with a small number of pixels.

Although FIG. 6 illustrates that the first sub-pixels Pm are arranged in a pentile matrix structure, the disclosure is not limited thereto. For example, the first sub-pixels Pm may be arranged in various shapes, for example, a stripe structure, a mosaic arrangement structure, a delta arrangement structure, and the like.

Figure 7:
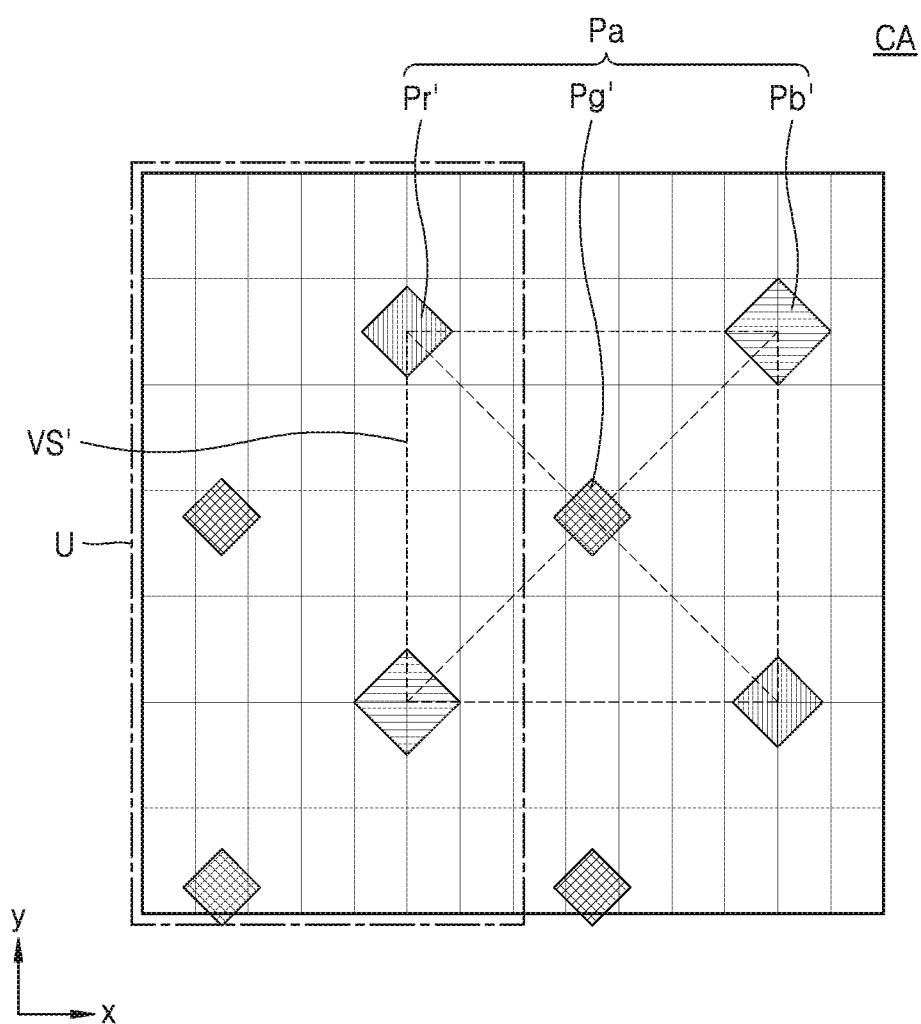
FIG. 7 is a layout diagram schematically illustrating an arrangement of sub-pixels in a component area according to an embodiment.

FIG. 7 is a layout diagram schematically illustrating an arrangement of sub-pixels in a component area CA according to an embodiment.

Referring to FIG. 7, the second sub-pixels Pa in the component area CA may include a plurality of colored sub-pixels, for example, a second red sub-pixel Pr', a second green sub-pixel Pg', and a second blue sub-pixel Pb'. The second red sub-pixel Pr', the second green sub-pixel Pg', and the second blue sub-pixel Pb' may implement red light, green light, and blue light, respectively.

The second sub-pixels Pa may have a pixel arrangement structure having a pentile matrix structure in which the four colored second sub-pixels are arranged at the vertices of a virtual quadrangle VS'.

In the component area CA, basic units U in which a certain number of second colored sub-pixels are grouped may be repeatedly arranged in the x direction and the y direction. In FIG. 7, the basic unit U may have a shape in which two second green sub-pixels Pg', one second red sub-pixel Pr', and one blue sub-pixel Pb' are grouped in a square shape.

A corresponding unit U' in the main display area MDA illustrated in FIG. 6 may have the same area as that of the basic unit U in the component area CA. In this case, the number of first colored sub-pixels included in the corresponding unit U' may be greater than the number of colored second sub-pixels included in the basic unit U. That is, the number of second colored sub-pixels Pa included in the basic unit U may be 4, and the number of first colored sub-pixels Pm included in the corresponding unit U' may be 56.

Because the number of colored second sub-pixels included in the basic unit U is less than the number of first colored sub-pixels included in the corresponding unit U', a distance between adjacent second colored sub-pixels in the basic area U may be greater than that between adjacent first colored sub-pixels in the corresponding unit U'.

The pixel arrangement and arrangement method illustrated in FIGS. 6 and 7 are exemplary, and the disclosure is not limited thereto. A design change may be made to the arrangement structure, number, or arrangement method of the second sub-pixels Pa included in the basic unit U according to the resolution of the component area CA. For example, the pixel arrangement structure of the main display area MDA may be different from the pixel arrangement structure of the component area CA.

Figure 8:
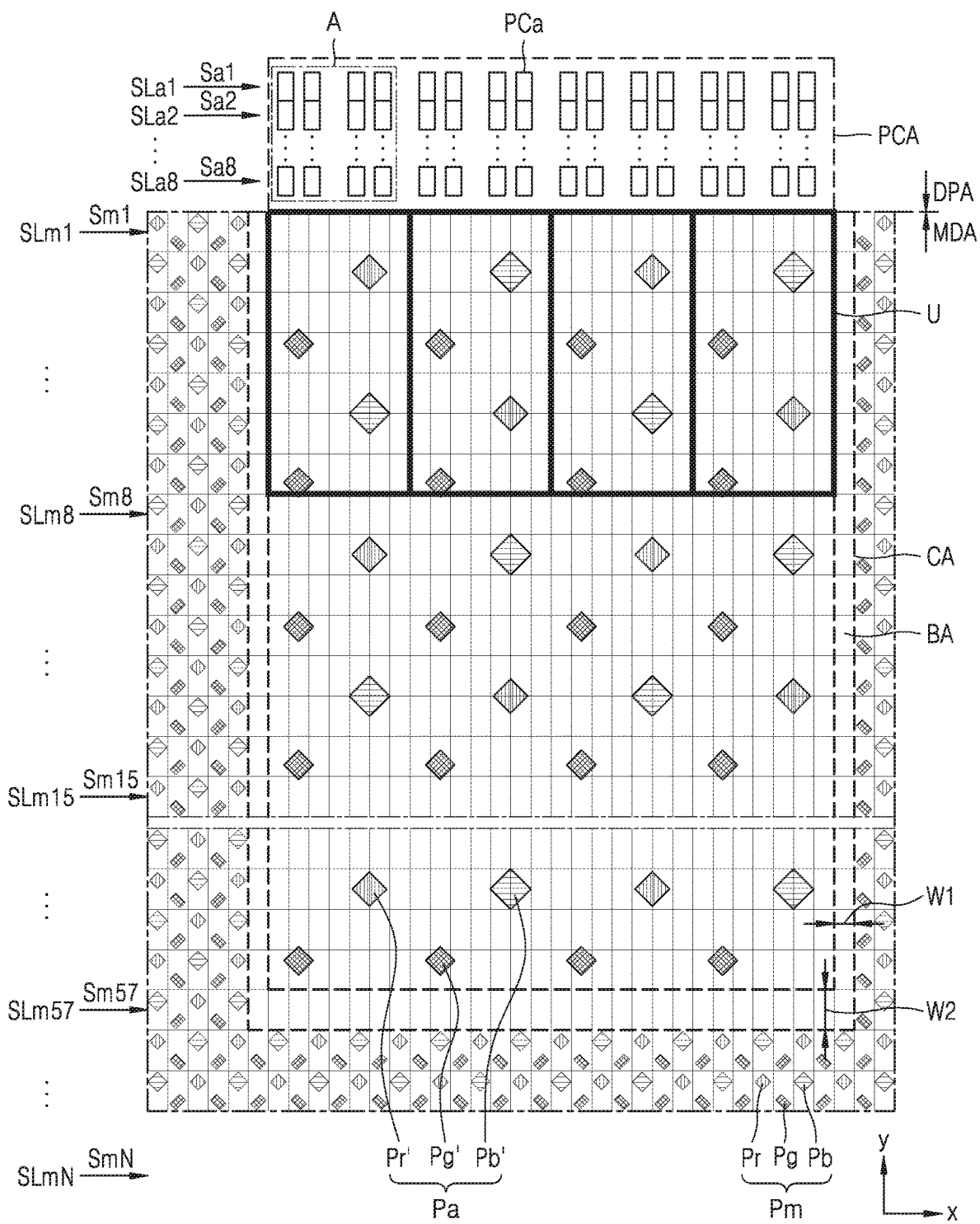
FIG. 8 is a planar layout diagram schematically illustrating a partial area of a display panel according to an embodiment.
Figure 9:
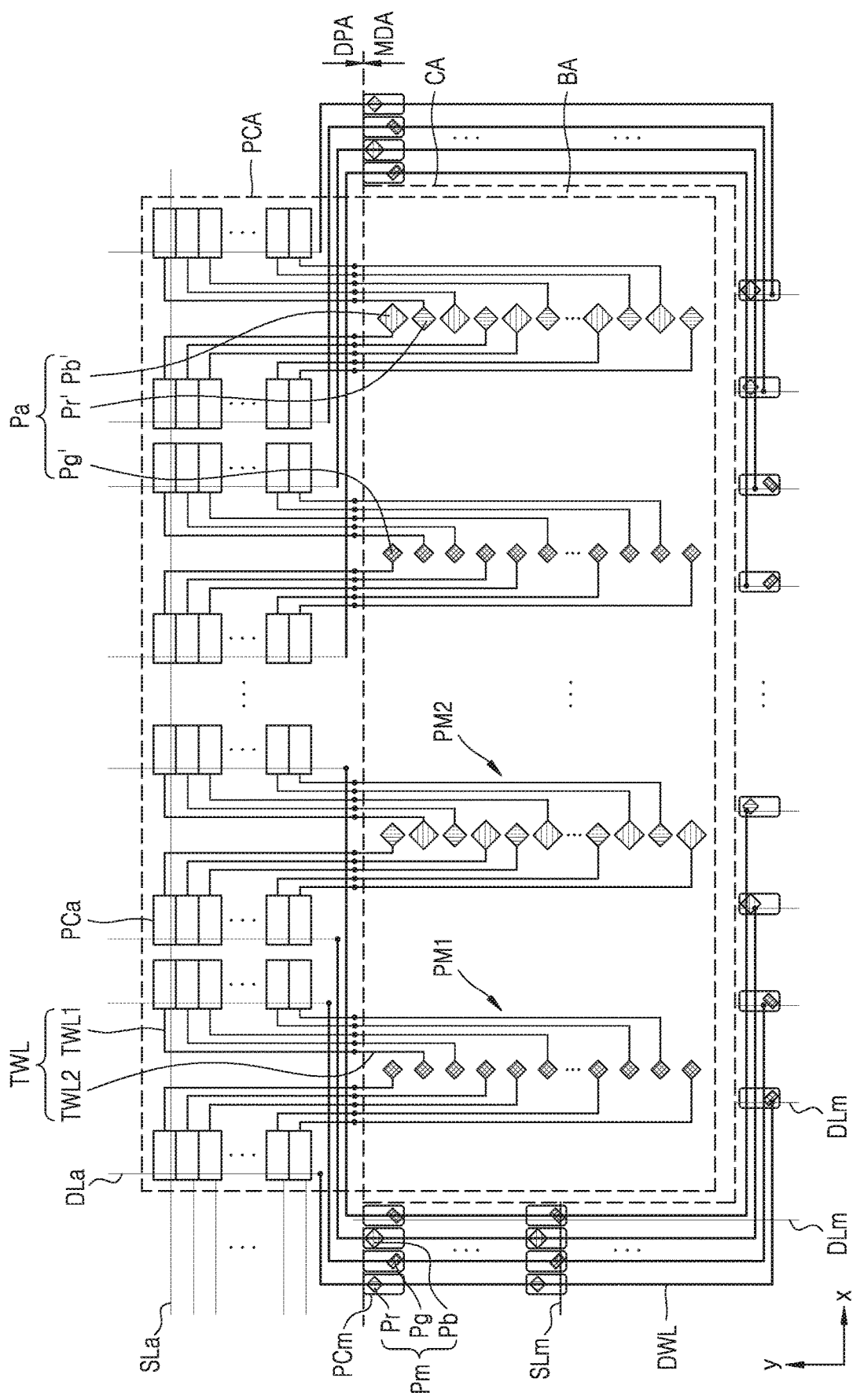
FIGS. 9 and 10 are diagrams schematically illustrating a partial area of FIG. 8.
Figure 10:
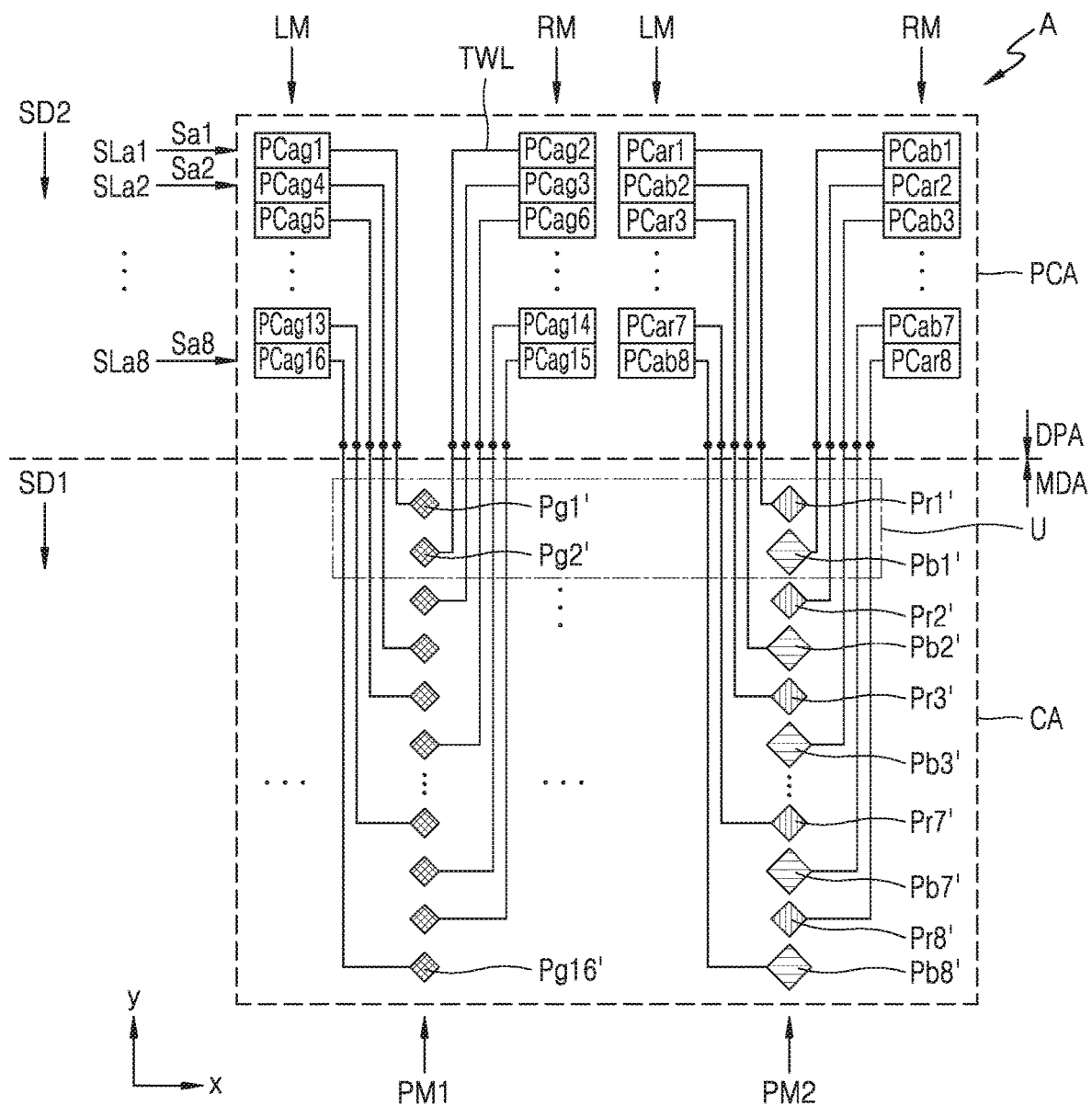
Figure 11:
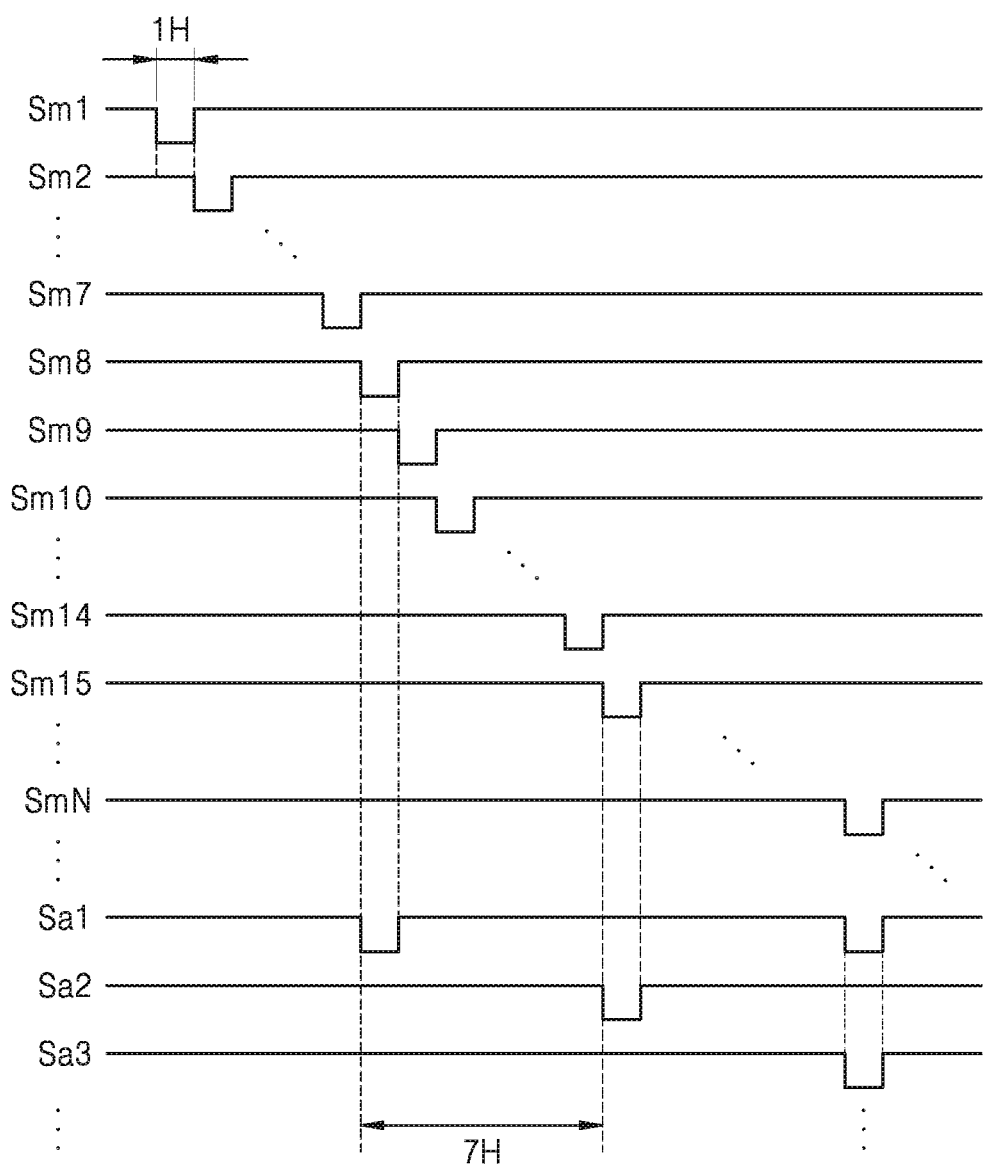
FIG. 11 is a timing diagram of scan signals applied to a display panel.

FIG. 8 is a planar layout diagram schematically illustrating a partial area of a display panel 10 according to an embodiment. Specifically, FIG. 8 partially illustrates a component area CA, and a main display area MDA and a peripheral area DPA surrounding the component area CA. FIGS. 9 and 10 are diagrams schematically illustrating a partial area of FIG. 8. FIG. 10 is a diagram schematically illustrating region A of FIG. 8. FIG. 11 is a timing diagram of scan signals applied to a display panel. FIGS. 12A to 13B are diagrams for explaining a scan signal and a data signal applied to the component area.

Referring to FIG. 8, the display area DA of the display panel 10 may include the component area CA and the main display area MDA. In an embodiment, the component area CA may include a boundary area BA. The boundary area BA is a transmission area in which a display element and a pixel circuit are not arranged, and may be a portion of the component area CA. The boundary area BA is provided along the periphery of the basic units U of the component area CA and is disposed adjacent to the main display area MDA. The boundary area BA may have a width W1 of one row of the main display area MDA in the x direction and a width W2 of one column of the main display area MDA in the y direction.

A plurality of first sub-pixels Pm may be arranged in the main display area MDA in a pentile structure. The first pixel circuits PCm may be arranged in the main display area MDA to overlap the first sub-pixels Pm, and the first pixel circuits PCm may be arranged in a matrix shape in the x direction and the y direction.

A plurality of second sub-pixels Pa may be arranged in the component area CA in a pentile structure. In this case, a distance between the second sub-pixels Pa in the component area CA may be greater than a distance between the first sub-pixels Pm. On the other hand, a region of the component area CA in which the second sub-pixels Pa are not arranged may be referred to as a transmission area TA having a high light transmittance.

The second pixel circuits PCa that control light emission of the second sub-pixels Pa may be arranged in the pixel circuit area PCA in the peripheral area DPA. Because the second pixel circuits PCa are not arranged in the component area CA, the component area CA may secure a wider transmission area TA.

As illustrated in FIG. 9, the second pixel circuits PCa may be connected to the second sub-pixels Pa by connection lines TWL, respectively. The connection lines TWL may extend in the y direction and may connect the second sub-pixels Pa to the second pixel circuits PCa, respectively. The expression "the connection line TWL is connected to the second sub-pixel Pa" may mean that the connection line TWL is electrically connected to the pixel electrode of the display element implementing the second sub-pixel Pa. The expression "the connection line TWL is connected to the second pixel circuit PCa" may mean that the connection line TWL is electrically connected to at least one of circuit elements constituting the second pixel circuit PCa, for example, a thin-film transistor.

The connection line TWL may include a first connection line TWL1 disposed in the peripheral area DPA and a second connection line TWL2 disposed in the component area CA. The first connection line TWL1 and the second connection line TWL2 may be disposed on different layers from each other. When the first connection line TWL1 and the second connection line TWL2 are disposed on different layers from each other, the first connection line TWL1 and the second connection line TWL2 may be connected to each other via a contact hole. The first connection line TWL1 may have a conductivity higher than that of the second connection line TWL2. Because the first connection line TWL1 is arranged in the peripheral area DPA, it is unnecessary to secure light transmittance. Therefore, the first connection line TWL1 may include a material having a light transmittance lower than that of the second connection line TWL2 but having a conductivity higher than that of the second connection line TWL2. Accordingly, a resistance of the connection line TWL may be minimized.

The first connection line TWL1 may be arranged in the peripheral area DPA and connected to the second pixel circuit PCa through the second connection line TWL2. The first connection line TWL1 may include a conductive material including molybdenum (Mo), aluminum (Al), copper (Cu), titanium (Ti), and the like, and may include a single layer or multiple layers including the above-described material. A plurality of first connection lines TWL1 may be disposed between the second pixel circuits PCa.

The second connection line TWL2 may be arranged in the component area CA and connected to the first connection line TWL1 in the peripheral area DPA disposed adjacent to the component area CA. The second connection line TWL2 may include a transparent conductive material. For example, the second connection line TWL2 may include a transparent conducting oxide (TCO). The second connection line TWL2 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

As illustrated in FIG. 9, the first connection line TWL1 and the second connection line TWL2 may be disposed on different layers from each other and electrically connected to each other. In another embodiment, the first connection line TWL1 and the second connection line TWL2 may be disposed on the same layer, and the connection line TWL may be integrally provided from the peripheral area DPA to the second sub-pixels Pa of the component area CA.

The scan line SL may include main scan lines SLm connected to the first pixel circuits PCm and auxiliary scan lines SLa connected to the second pixel circuits PCa. The main scan line SLm may extend along the x direction in the main display area MDA and may be connected to the first pixel circuits PCm arranged in the same row. The main scan lines SLm may not be arranged in the component area CA. That is, the main scan lines SLm may be disconnected with the component area CA disposed therebetween. In this case, the main scan line SLm disposed on the left side of the component area CA may be configured to receive the scan signal from the first scan driving circuit (see SDRV1 of FIG. 3), and the main scan line SLm disposed on the right side of the component area CA may be configured to receive the scan signal from the second scan driving circuit (see SDRV2 of FIG. 3). The auxiliary scan line SLa may extend along the x direction in the peripheral area DPA and may be connected to the second pixel circuits PCa arranged in the same row.

The data lines DL may include main data lines DLm connected to the first pixel circuits PCm and auxiliary data lines DLa connected to the second pixel circuits PCa. The main data lines DLm may extend along the y direction and may be connected to the first pixel circuits PCm arranged in the same column. The auxiliary data lines DLa may extend along the y direction and may be connected to the second pixel circuits PCa arranged in the same column.

Some main data lines DLm may be connected to the auxiliary data lines DLa by data connection lines DWL. The first pixel circuits PCm and the second pixel circuits PCa, which are connected to the main data lines DLm and the auxiliary data lines DLa by the data connection lines DWL, may receive data signals through the same fan-out line FW.

As illustrated in FIG. 9, the data connection lines DWL may bypass the component area CA. The data connection lines DWL may be arranged to overlap the first pixel circuits PCm arranged in the main display area MDA. Because the data connection lines DWL are arranged in the main display area MDA, it is unnecessary to secure a separate space in which the data connection lines DWL are arranged. Therefore, the area of a dead space may be minimized.

The data connection lines DWL may be disposed on layers different from the main data lines DLm and the auxiliary data lines DLa, and the data connection lines DWL may be connected to the main data lines DLm and the auxiliary data lines DLa through contact holes, respectively.

FIG. 8 illustrates an example in which a total of 10 basic units U (4 basic units in the x direction and 2.5 basic units in the y direction) are provided in the component area CA. This is exemplary, and the number of basic units U provided in the component area CA may vary depending on the resolution of the component area CA.

As illustrated in FIGS. 8 to 10, a first sub-pixel column PM1 in which second green sub-pixels Pg' are repeatedly arranged in the y direction and a second sub-pixel column PM2 in which second red sub-pixels Pr' and second blue sub-pixels Pb' are alternately arranged in the y direction may be alternately arranged in the component area CA in the x direction. Second red sub-pixels Pr' and second blue sub-pixels Pb' may be alternately arranged in the second sub-pixel columns PM2 disposed adjacent to the first sub-pixel column PM1.

In the pixel circuit area PCA, the second pixel circuits PCa that drive the second green sub-pixels Pg' of the first sub-pixel column PM1 may be arranged in a left circuit column LM and a right circuit column RM. Second pixel circuits connected to adjacent second green sub-pixels Pg' in the first sub-pixel column PM1 may be disposed in the same row so that pairs of adjacent second green sub-pixels Pg1' and Pg2', Pg3' and Pg4', Pg5' and Pg6', . . . , and Pg15' and Pg16' in the first sub-pixel column PM1 are simultaneously selected by the scan signal and emit light at the same time. Also, the second pixel circuits PCag1 to PCag16 may be arranged in the left circuit column LM and the right circuit column RM so that the connection lines TWL do not cross each other. To this end, from the second second red sub-pixel Pg2', the second pixel circuits PCag1 to PCag16 connected to pairs of second green sub-pixels Pg2' and Pg3', Pg4' and Pg5', Pg6' and Pg7', . . . , Pg14' and Pg15' may be arranged in the left circuit column LM and the right circuit column RM. That is, the second pixel circuits PCa1 to PCa16 connected to the second green sub-pixels Pg1' to Pg16' may be sequentially arranged in the order of left, right, right, left, left, right, . . . . That is, the second pixel circuits PCag1, PCag4, PCag5, . . . , PCag13, and PCag16 may be arranged in the left circuit column LM, and the second pixel circuits PCag2, PCag3, PCag6, . . . , PCag14, and PCag15 may be arranged in the right circuit column RM. According to the above rule, as illustrated in FIG. 10, the second pixel circuits PCag1 and PCag16 of the second green sub-pixels PO' and Pg16' arranged in the first and last rows are arranged in the left circuit column LM.

Similarly, the second pixel circuits PCa that drive the second red sub-pixels Pr' and the second blue sub-pixels Pb' of the second sub-pixel column PM2 may be arranged in the left circuit column LM and the right circuit column RM. Also, second pixel circuits PCar1 to PCar8 and PCab1 to PCab8 may be arranged in the left circuit column LM and the right circuit column RM so that the connection lines TWL do not cross each other.

When the first second sub-pixel of the second sub-pixel column PM2 is the second red sub-pixel Pr', second pixel circuits PCar1 to PCar8 and PCab1 to PCab8 may be arranged so that a pair of a second red sub-pixel Pr' and a second blue sub-pixel Pb' adjacent to each other are simultaneously selected by the scan signal and emit light at the same time. To this end, from the second blue sub-pixel Pb1' of the second row, the second pixel circuits PCar1 to PCar8 and PCab1 to PCab8 connected to pairs Pb1' and Pr2', Pb2' and Pr3', Pb3' and Pr4', . . . , Pb7' and Pr8' of second blue sub-pixels and second red sub-pixels may be arranged in the right circuit column RM and the left circuit column LM. That is, the second pixel circuits PCar1 to PCar8 and Pcab1 to PCab8 connected to the second red sub-pixels Pr1 ' to Pr8' and the second blue sub-pixels Pb1' to Pb8' may be sequentially arranged in the order of left, right, right, left, left, right, . . . . That is, the second pixel circuits PCar1, PCab2, PCar3, . . . , PCar7, and PCab8 may be arranged in the left circuit column LM, and the second pixel circuits PCab1, PCar2, PCab3, . . . , PCab7, and PCar8 may be arranged in the right circuit column RM.

According to the above rule, as illustrated in FIG. 10, the second pixel circuits PCar1 and PCab8 of the second red sub-pixel Pr1' arranged at the first row of the second sub-pixel column PM2 and the second blue sub-pixel Pb8' arranged at the last row of the second sub-pixel column PM2 are arranged in the left circuit column LM.

In the right circuit column RM and the left circuit column LM, the second pixel circuit PCar connected to the second red sub-pixel Pr' and the second pixel circuit PCab connected to the second blue sub-pixel Pb' may be alternately arranged in the y direction.

Similarly, when the first second sub-pixel Pa of the second sub-pixel column PM2 is the second blue sub-pixel Pb', the second pixel circuits PCab1, PCar2, PCab3, . . . , PCab7, and PCar8 may be arranged in the left circuit column LM, the second pixel circuits PCar1, PCab2, PCar3, . . . , PCar7, and PCab8 may be arranged in the right circuit column RM.

The second pixel circuits PCa connected to the second red sub-pixel Pr', the second green sub-pixel Pg', and the second blue sub-pixels Pb' in the basic units U may be connected to the same auxiliary scan line SLa. Therefore, when the second scan signal Sa is applied to the auxiliary scan line SLa, data signals corresponding to the corresponding second red sub-pixel Pr', second green sub-pixels Pg', and second blue sub-pixel Pb' of the second pixel circuits PCa connected to the auxiliary scan line SLa may be applied through the fan-out line FW, the main data line DLm, the data connection line DWL, and the auxiliary data line DLa.

FIG. 10 illustrates that the second pixel circuits PCa are arranged in the order of left, right, right, left, left, right, . . . , but in another embodiment, the second pixel circuits PCa may be arranged in the order of right, left, left, right, right, left, . . . .

As illustrated in FIG. 11, the first scan signals Sm1 to SmN may be sequentially applied to the first to last rows of the main display area MDA through the main scan lines SLm1 to SLmN of the main display area MDA along the first scan direction SD1. The second scan signals Sa1 to Sa8 may be sequentially applied to the first to last rows of the pixel circuit area PCA through the auxiliary scan lines SLa1 to SLa8 of the component area CA in the second scan direction SD2. The first scan direction SD1 of the first scan signals Sm1 to SmN may be the same as the second scan direction SD2 of the second scan signals Sa1 to Sa8.

In an embodiment, the first scan signals Sm1 to SmN may have a low level with a width corresponding to 1 horizontal period (1H) and may be output from the first scan driver SDRV1 and the second scan driver SDRV2 to have a wave form shifted by 1 horizontal period (1H) from a previous scan signal. The second scan signals Sa1 to Sa8 may be synchronized with a timing at which the first scan signals are applied to the (7k+1)th main scan lines SLm (where k is a natural number) of the main display area MDA, and may be output from the third scan driver SDRV3 to the auxiliary scan lines SLa of the pixel circuit area PCA to have a wave from shifted by 7 horizontal periods (7H).

Figure 12A:
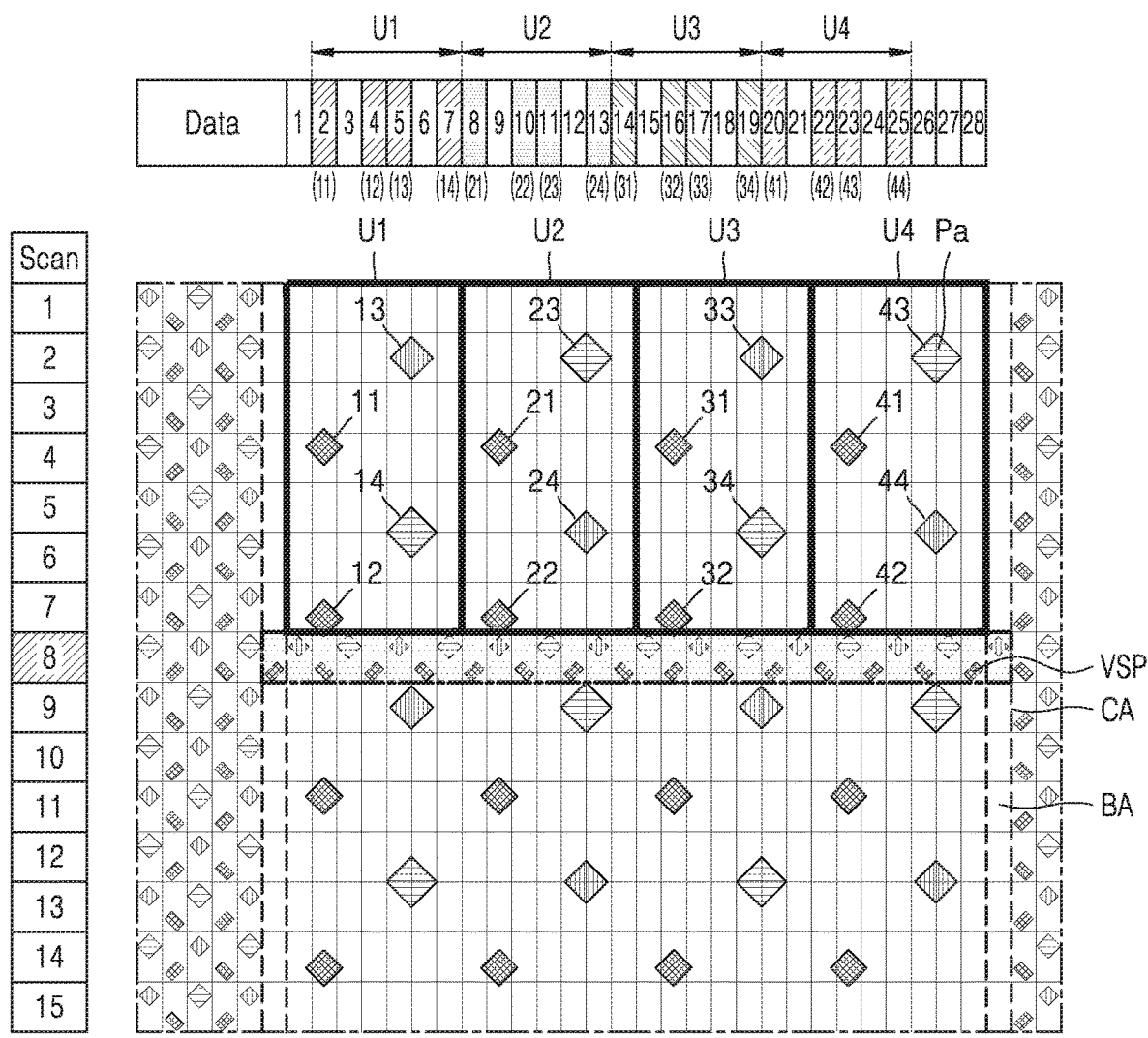
Figure 13A:
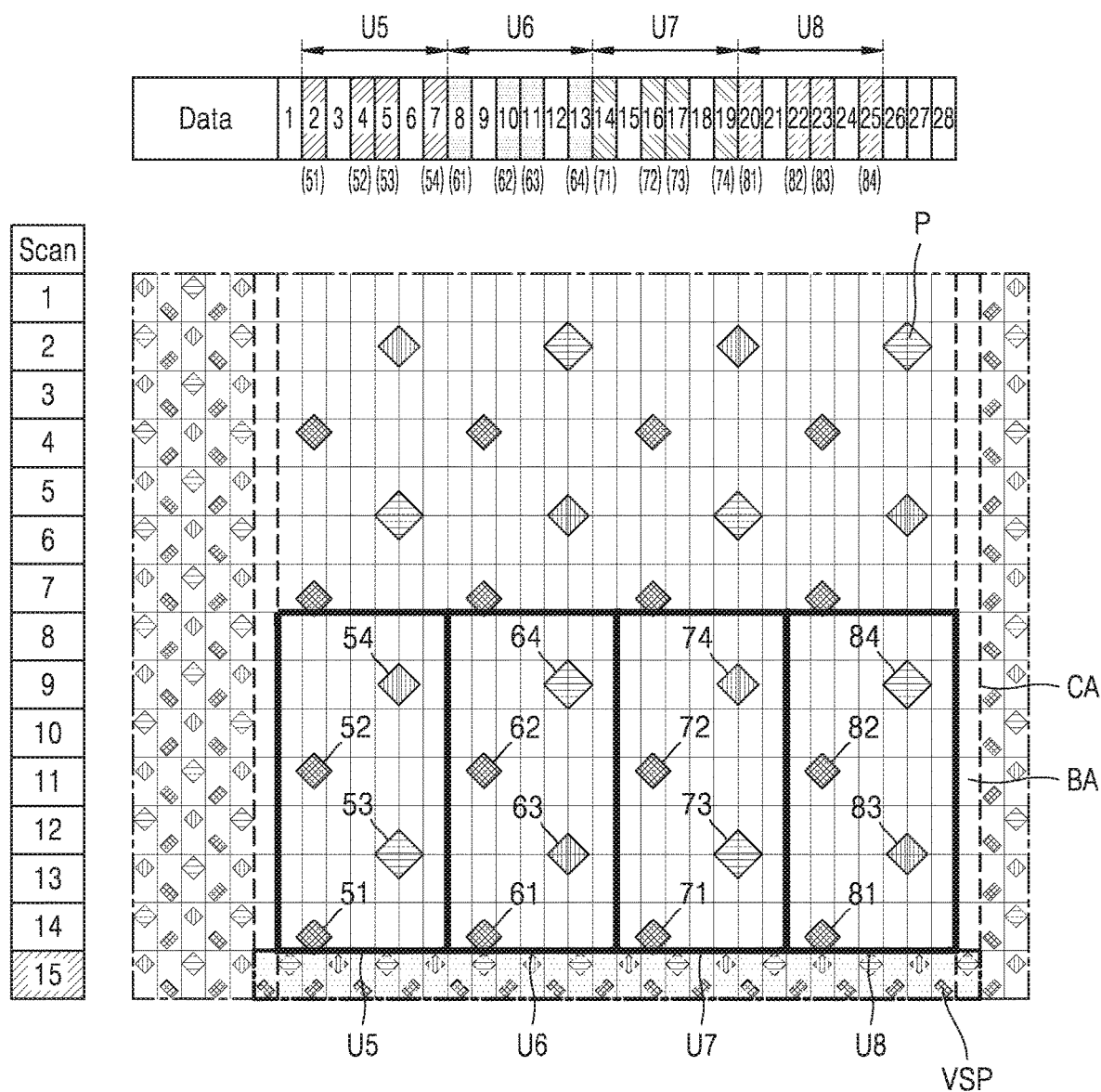

In FIGS. 12A and 13A, the number on the left indicates the order of the main scan lines or the first scan signals, and the number on the upper side indicates the order of the main data lines arranged in columns corresponding to the component area CA among the columns of the main display area MDA. The columns of the boundary area BA are not included. For example, FIGS. 12A and 13A illustrate the order of the first to fifteenth main scan lines corresponding to the first to fifteenth rows of the main display area MDA and 28 main data lines arranged in 28 columns corresponding to the component area CA. FIGS. 12B and 13B illustrate emission colors and main data lines connected to second sub-pixels in basic units.

First, referring to FIGS. 12A and 12B, auxiliary data lines connected to second pixel circuits PCa of second sub-pixels 11 to 14 arranged in a first basic unit U1 may be respectively connected through data connection lines to second, fourth, fifth, and seventh main data lines among 28 main data lines. Auxiliary data lines connected to second pixel circuits PCa of second sub-pixels 21 to 24 arranged in a second basic unit U2 may be respectively connected through data connection lines to eighth, tenth, eleventh, and thirteenth main data lines among the 28 main data lines. Auxiliary data lines connected to second pixel circuits PCa of second sub-pixels 31 to 34 arranged in a third basic unit U3 may be respectively connected through data connection lines to fourteenth, sixteenth, seventeenth, and nineteenth main data lines. Auxiliary data lines connected to second pixel circuits PCa of second sub-pixels 41 to 44 arranged in a fourth basic unit U4 may be respectively connected through data connection lines to twentieth, twenty-second, twenty-third, and twenty-fifth main data lines.

Second pixel circuits PCa connected to a first auxiliary scan line SLa1 may be respectively connected to the second sub-pixels 11 to 14, 21 to 24, 31 to 34, and 41 to 44 provided in the first to fourth basic units U1 to U4. A second scan signal Sa1 may be applied to a first auxiliary scan line SLa1 at a timing when a first scan signal Sm8 is applied to an eighth main scan line SLm8. Therefore, the corresponding data signals may be respectively applied to the second pixel circuit PCa connected to the second sub-pixels 11 to 14, 21 to 24, 31 to 34, and 41 to 44 provided in the first to fourth basic units U1 to U4. The second sub-pixels 11 to 14, 21 to 24, 31 to 34, and 41 to 44 may emit light with luminance corresponding to the data signals.

FIG. 12A illustrates virtual sub-pixels VSP (virtual first sub-pixels) disposed in the component area along the extension line of the eighth row of the main display area MDA. The virtual sub-pixel VSP may have a same configuration as the sub-pixels disposed in the main display area MDA. The applied data signals and the main data lines connected to the second sub-pixels 11 to 14, 21 to 24, 31 to 34, and 41 to 44 provided in the first to fourth basic units U1 to U4 may be determined by the arrangement of the virtual sub-pixels VSP. For example, auxiliary data lines connected to the second sub-pixels 11 to 14 provided in the first basic unit U1 may be respectively connected through data connection lines to second, fourth, fifth, and seventh main data lines among the 28 main data lines. It may be seen from FIG. 12A that the second, fourth, fifth, and seventh columns among the virtual sub-pixels VSP provided along the extension line of the eighth row correspond to a green sub-pixel, a green sub-pixel, a red sub-pixel, and a blue sub-pixel, respectively.

Next, referring to FIGS. 13A and 13B, auxiliary data lines connected to second pixel circuits PCa of second sub-pixels 51 to 54 arranged in a fifth basic unit U5 may be respectively connected through data connection lines to second, fourth, fifth, and seventh main data lines among 28 main data lines. Auxiliary data lines connected to second pixel circuits PCa of second sub-pixels 61 to 64 arranged in a sixth basic unit U6 may be respectively connected through data connection lines to eighth, tenth, eleventh, and thirteenth main data lines among the 28 main data lines. Auxiliary data lines connected to second pixel circuits PCa of second sub-pixels 71 to 74 arranged in a seventh basic unit U7 may be respectively connected through data connection lines to fourteenth, sixteenth, seventeenth, and nineteenth main data lines. Auxiliary data lines connected to second pixel circuits PCa of second sub-pixels 81 to 84 arranged in an eighth basic unit U8 may be respectively connected through data connection lines to twentieth, twenty-second, twenty-third, and twenty-fifth main data lines.

Second pixel circuits PCa connected to a second auxiliary scan line SLa2 may be respectively connected to the second sub-pixels 51 to 54, 61 to 64, 71 to 74, and 81 to 84 provided in the fifth to eighth basic units U5 to U8. A second scan signal Sa2 may be applied to a second auxiliary scan line SLa2 at a timing when a first scan signal Sm15 is applied to a fifteenth main scan line SLm15. Therefore, the corresponding data signals may be respectively applied to the second pixel circuit PCa connected to the second sub-pixels 51 to 54, 61 to 64, 71 to 74, and 81 to 84 provided in the fifth to eighth basic units U5 to U8. The second sub-pixels 51 to 54, 61 to 64, 71 to 74, and 81 to 84 may emit light with luminance corresponding to the data signals.

FIG. 13A illustrates virtual sub-pixels VSP along the extension line of the fifteenth row of the main display area MDA in the component area CA. The applied data signals and the main data lines connected to the second sub-pixels 51 to 54, 61 to 64, 71 to 74, and 81 to 84 provided in the fifth to eighth basic units U5 to U8 may be determined by the arrangement of the virtual sub-pixels VSP. For example, auxiliary data lines connected to the second sub-pixels 51 to 54 provided in the fifth basic unit U5 may be respectively connected through data connection lines DWL to second, fourth, fifth, and seventh main data lines among the 28 main data lines. It may be seen from FIG. 13A that the second, fourth, fifth, and seventh columns among the virtual sub-pixels VSP provided along the extension line of the fifteenth row correspond to a green sub-pixel, a green sub-pixel, a blue sub-pixel, and a red sub-pixel, respectively.

The application of the scan signals and the data signals applied to the second sub-pixel described with reference to FIGS. 12A to 13B may be equally applied to subsequent basic units.

The data signals applied to the second sub-pixels PCa of the component area CA may be data signals generated by mapping data signals to be applied to the virtual sub-pixels VSP of the component area CA by the display driver (see 32 of FIG. 3) to the second sub-pixels PCa. The virtual sub-pixel VSP may be a first sub-pixel to be arranged when the component area CA is the main display area MDA. For example, the second sub-pixel 11 illustrated in FIG. 12A may be a green sub-pixel, and the data signal applied to the second sub-pixel 11 may be generated based on the data signal allocated to green sub-pixels among the virtual sub-pixels VSP included in a certain area surrounding the second sub-pixel 11 within the component area CA.

Figure 14:
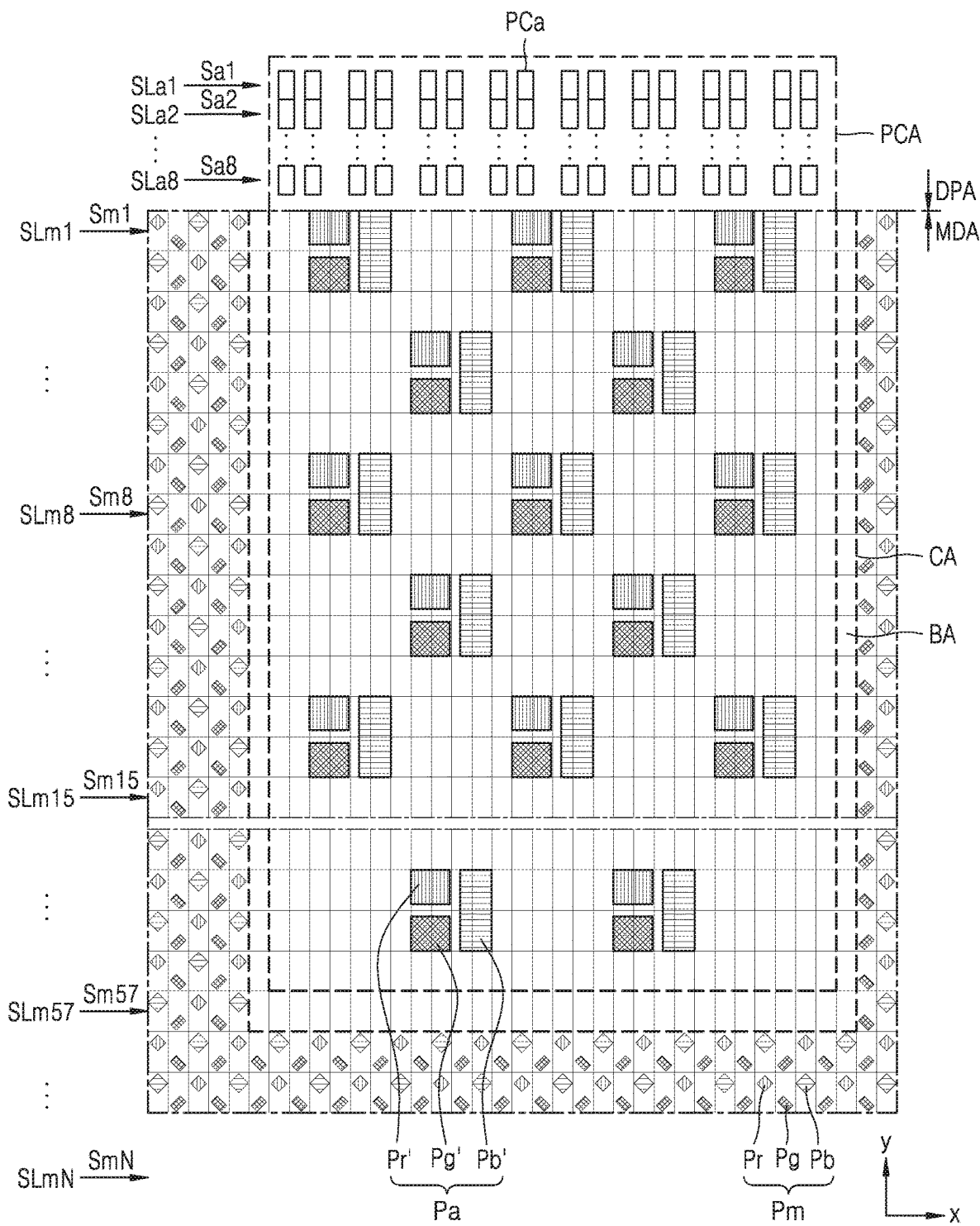
FIG. 14 is a planar layout diagram schematically illustrating a partial area of a display panel according to an embodiment.
Figure 15:
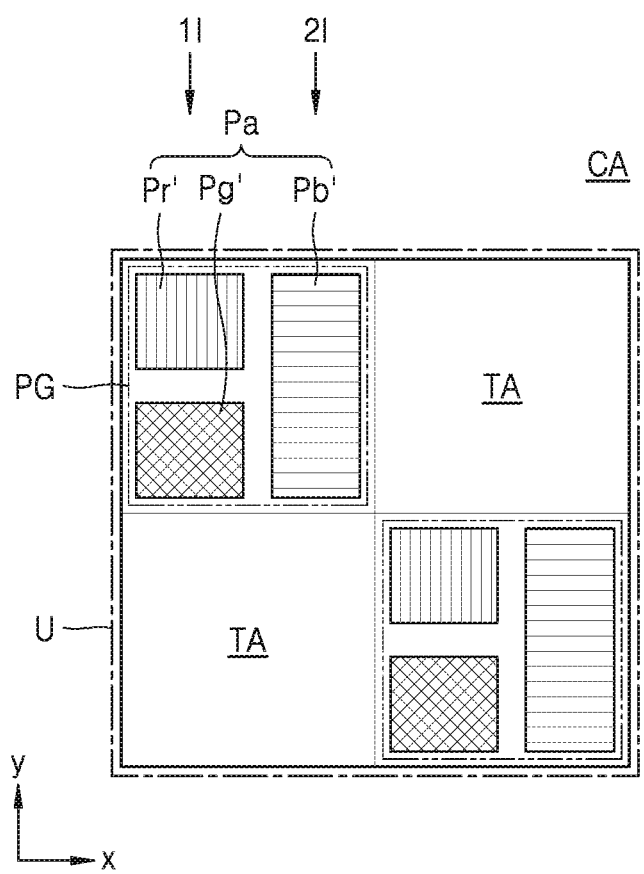
FIG. 15 is a layout diagram schematically illustrating an arrangement of sub-pixels in a component area of FIG. 14 according to an embodiment.
Figure 16:
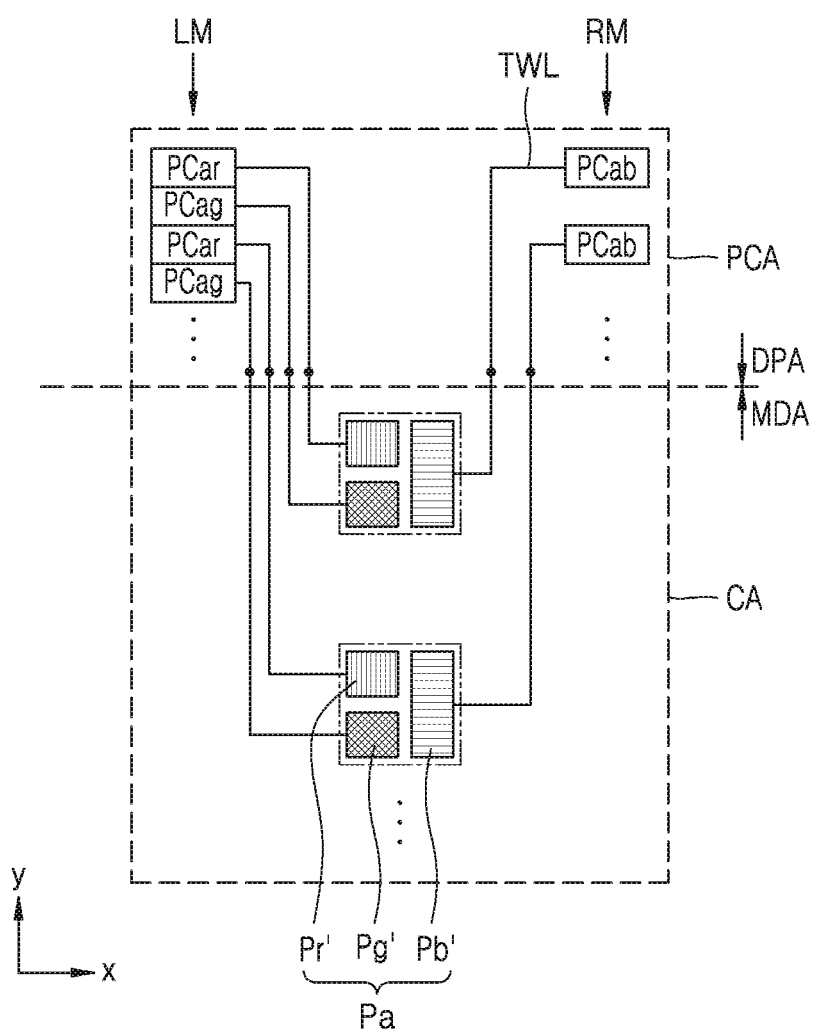
FIG. 16 is a diagram schematically illustrating a connection between a second sub-pixel and a second pixel circuit of FIG. 14.

FIG. 14 is a planar layout diagram schematically illustrating a partial area of a display panel according to an embodiment. FIG. 15 is a layout diagram schematically illustrating an arrangement of sub-pixels in a component area of FIG. 14. FIG. 16 is a diagram schematically illustrating a connection between a second sub-pixel and a second pixel circuit of FIG. 14.

Referring to FIG. 14, first sub-pixels Pm may be arranged in a main display area MDA in a pentile structure in the same manner as the pixel arrangement structure illustrated in FIG. 8, and second sub-pixels Pa may be arranged in a component area CA in an S-stripe structure. As illustrated in FIG. 15, the component area CA may include pixel groups PG in which a second red sub-pixel Pr', a second green sub-pixel Pg', and a second blue sub-pixel Pb' are disposed adjacent to each other, and a transmission area TA surrounding the pixel groups PG. The pixel group PG may be defined as second sub-pixels Pa which are grouped in a preset unit.

In the component area CA, basic units U in which a certain number of pixel groups PG and a certain number of transmission areas TA are grouped may be repeatedly arranged in the x direction and the y direction. The size (area) of the basic unit U illustrated in FIG. 15 may be different from the size of the basic unit U illustrated in FIG. 7.

In the present embodiment, the second red sub-pixels Pr' and the second green sub-pixels Pg' may be alternately arranged in a first column 1I, and the second blue sub-pixel Pb' may be arranged in a second column 2I adjacent to the first column 1I. In this case, the second red sub-pixel Pr' and the second green sub-pixel Pg' may be arranged in a rectangular shape having a long side in the x direction, and the second blue sub-pixels Pb' may be arranged in a rectangular shape having a long side in the y direction. The length of the second blue sub-pixel Pb' in the y direction may be equal to or greater than the sum of the length of the second red sub-pixel Pr' in the y direction and the length of the second green sub-pixel Pg' in the y direction. Therefore, the size of the second blue sub-pixel Pb' may be greater than the size of the second red sub-pixel Pr' and the second green sub-pixel Pg'.

The second pixel circuits connected to the second sub-pixels in the pixel groups PG arranged along the y direction may be arranged in the pixel circuit area PCA in two or more columns. For example, as illustrated in FIG. 16, the second pixel circuits PCar and PCag respectively connected to the second red sub-pixel Pr' and the second green sub-pixel Pg' of the first column 1I in the pixel group PG may be sequentially and alternately arranged in a left circuit column LM in the y direction. The second pixel circuits PCab connected to the second blue sub-pixels Pb' of a second column 2I may be sequentially arranged in a right circuit column RM in the y direction.

In the present embodiment, a dead space may be reduced compared with a case in which the second pixel circuits PCar and PCag respectively connected to the second red sub-pixel Pr' and the second green sub-pixel Pg' of the first column 1I in the pixel group PG and the second pixel circuits PCab connected to the second blue sub-pixels Pb' of the second column 2I are arranged in one column in the y direction.

Figure 17:
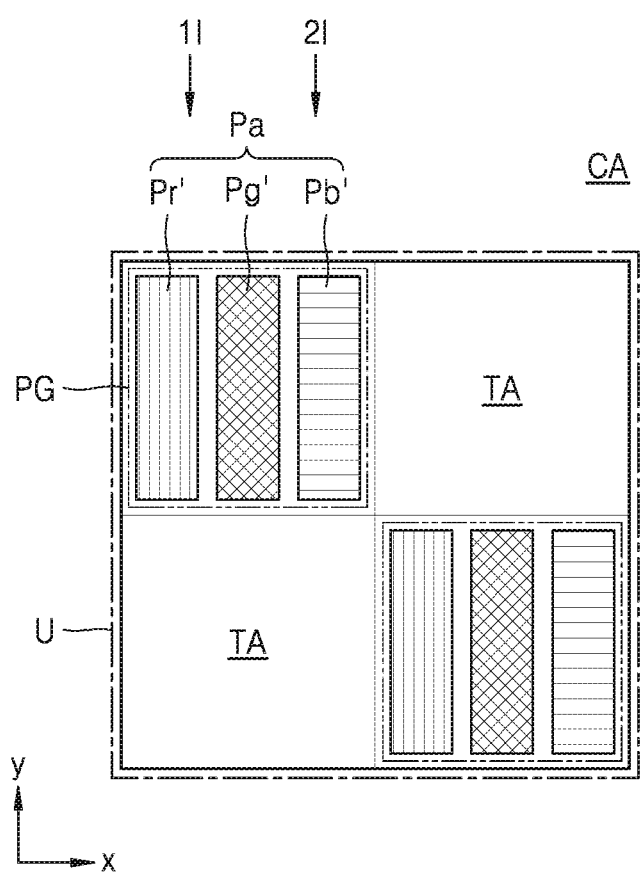
FIG. 17 is a layout diagram schematically illustrating an arrangement of sub-pixels in a component area according to an embodiment.
Figure 18:
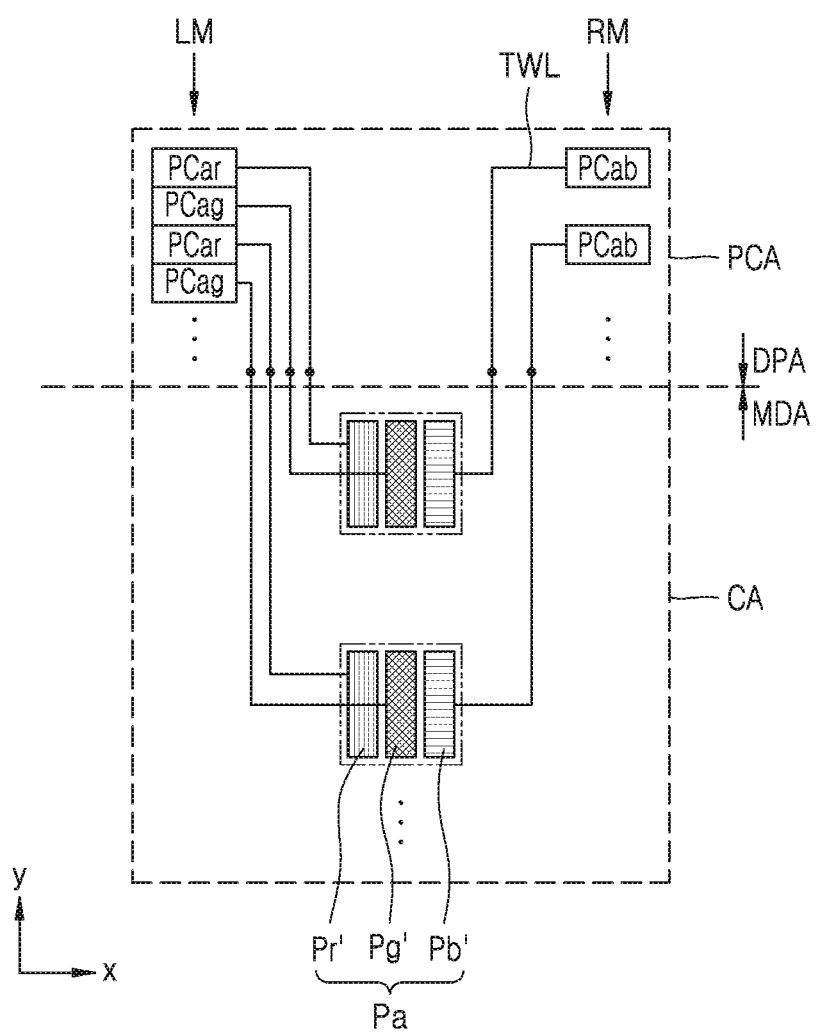
FIG. 18 is a diagram schematically illustrating a connection between a second sub-pixel and a second pixel circuit of FIG. 17.

FIG. 17 is a layout diagram schematically illustrating an arrangement structure of sub-pixels in a component area CA according to an embodiment. FIG. 18 is a diagram schematically illustrating a connection between a second sub-pixel and a second pixel circuit of FIG. 17. It is assumed that a pixel arrangement structure of a main display area MDA has a pentile structure similar to the pixel arrangement structure illustrated in FIG. 8.

As illustrated in FIG. 17, the pixel arrangement structure of the component area CA may have a stripe structure. In the component area CA, a second red sub-pixel Pr', a second green sub-pixel Pg', and a second blue sub-pixel Pb' may be arranged in parallel in the x direction. In this case, the second red sub-pixel Pr', the second green sub-pixel Pg', and the second blue sub-pixel Pb' may have a long side in the y direction. Alternatively, unlike illustrated, the second red sub-pixel Pr', the second green sub-pixel Pg', and the second blue sub-pixel Pb' may be arranged in parallel in the y direction. In this case, the second red sub-pixel Pr', the second green sub-pixel Pg', and the second blue sub-pixel Pb' may have a long side in the x direction.

In the component area CA, basic units U in which a certain number of pixel groups PG and a certain number of transmission areas TA are grouped may be repeatedly arranged in the x direction and the y direction. The size (area) of the basic unit U illustrated in FIG. 17 may be different from the size of the basic unit U illustrated in FIG. 7.

The second pixel circuits connected to the second sub-pixels in the pixel groups PG arranged in a line in the y direction may be arranged in the pixel circuit area PCA in two or more columns. For example, as illustrated in FIG. 18, the second pixel circuits PCar and PCag respectively connected to the second red sub-pixel Pr' and the second green sub-pixel Pg' in the pixel group PG may be sequentially and alternately arranged in a left circuit column LM in the y direction. The second pixel circuits PCab connected to the second blue sub-pixels Pb' may be sequentially arranged in a right circuit column RM in the y direction.

In the present embodiment, a dead space may be reduced compared with a case in which the second pixel circuits PCar and PCag respectively connected to the second red sub-pixel Pr' and the second green sub-pixel Pg' in the pixel group PG and the second pixel circuits PCab connected to the second blue sub-pixels Pb' are arranged in one column in the y direction.

Figure 19:
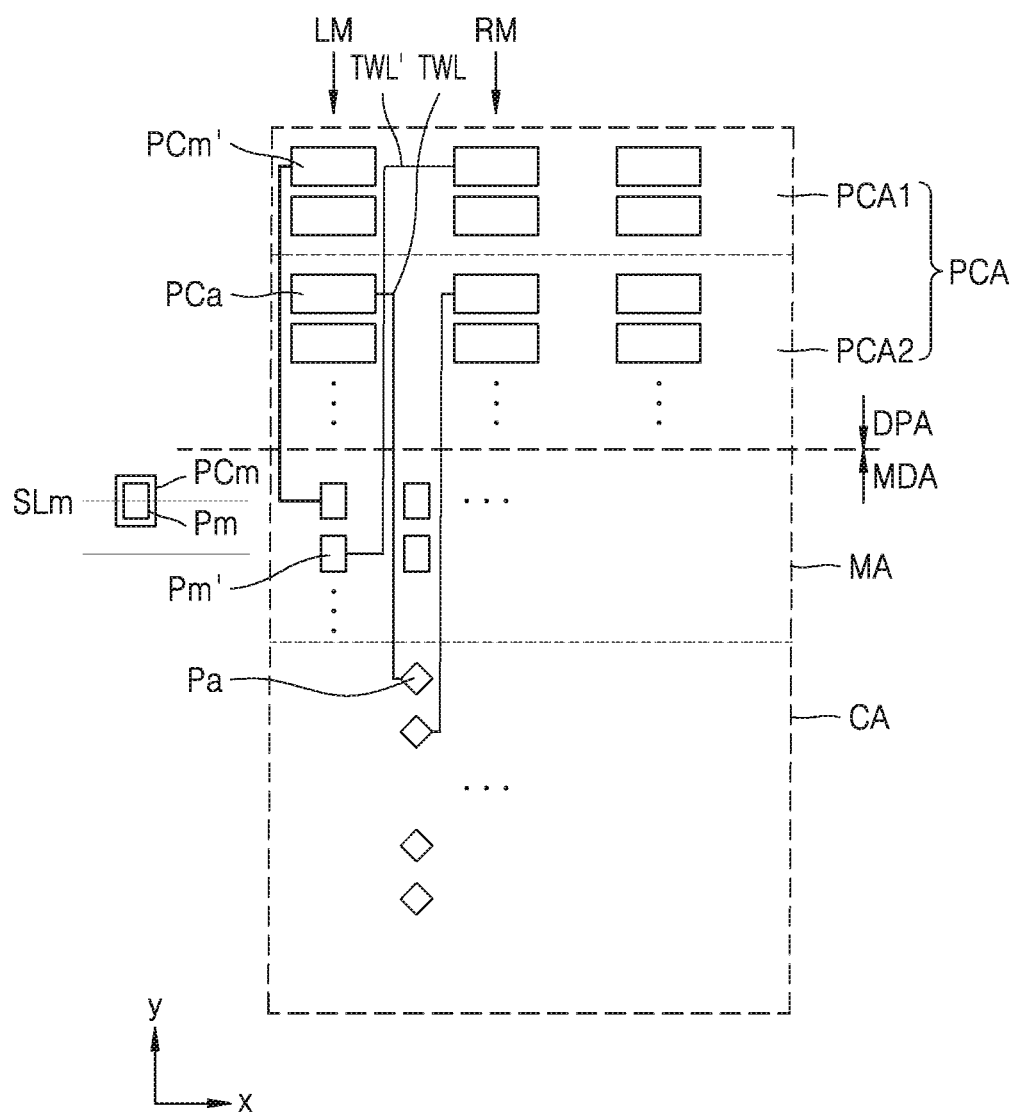
FIG. 19 is a planar layout diagram schematically illustrating a partial area of a display panel according to an embodiment.

FIG. 19 is a planar layout diagram schematically illustrating a partial area of a display panel according to an embodiment. Specifically, FIG. 19 partially illustrates a component area CA, and a main display area MDA and a peripheral area DPA surrounding the component area CA. The peripheral area DPA may include a pixel circuit area PCA, and a pixel circuit area PCA may include a first pixel circuit area PCA1 and a second pixel circuit area PCA2.

The embodiment of FIG. 19 differs from the above-described embodiments in that the component area CA is positioned in the main display area MDA and completely surrounded by the main display area MDA. The shape of the component area CA may have various shapes, for example, a circular shape, an elliptical shape, a polygonal shape such as a rectangular shape, a star shape, or a diamond shape.

A plurality of first sub-pixels Pm may be arranged in the main display area MDA. In an embodiment, the first sub-pixels Pm may be arranged in a pentile structure. The first pixel circuits PCm may be arranged in the main display area MDA to overlap the first sub-pixels Pm, and the first pixel circuits PCm may be arranged in a matrix shape in the x direction and the y direction.

First pixel circuits PCm' of first sub-pixels Pm' in a middle area MA of the main display area MDA disposed between the component area CA and the peripheral area DPA may be arranged in the first pixel circuit area PCA1 of the peripheral area DPA. The first sub-pixel Pm' in the middle area MA and the first pixel circuit PCm' in the first pixel circuit area PCA1 may be connected to each other by an additional connection line TWL'. The first pixel circuits PCm' connected to the first sub-pixels Pm' arranged in the same column in the y direction in the middle area MA may be arranged in the left circuit column LM and the right circuit column RM of the first pixel circuit area PCA1 as illustrated in FIG. 10.

The second pixel circuits PCa of the second sub-pixels Pa may be arranged in the second pixel circuit area PCA2 of the peripheral area DPA. The second sub-pixel Pa and the second pixel circuit PCa may be connected to each other by a connection line TWL. The second pixel circuits PCa connected to the second sub-pixels Pa arranged in the same column in the component area CA may be arranged in the left circuit column LM and the right circuit column RM of the second pixel circuit area PCA2 as illustrated in FIG. 10. In FIG. 19, for convenience of description and drawings, positions of the left circuit column LM and the right circuit column RM of the first pixel circuit area PCA1 are the same as those of the left circuit column LM and the right circuit column RM of the second pixel circuit area PCA2. In an embodiment, positions of the left circuit column LM and the right circuit column RM of the first pixel circuit area PCA1 may be different from those of the left circuit column LM and the right circuit column RM of the second pixel circuit area PCA2.

Figure 20:
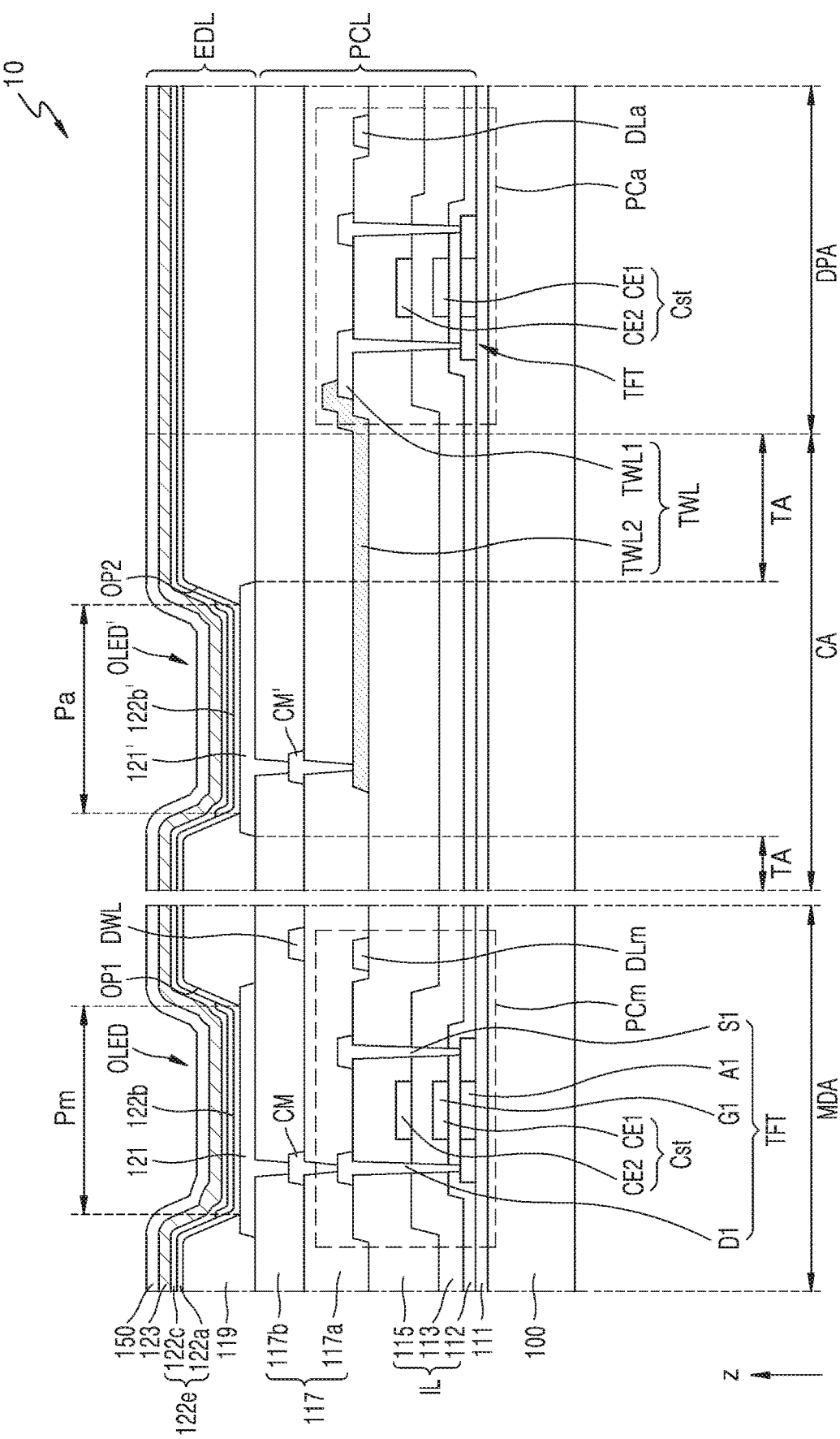
FIG. 20 is a schematic cross-sectional view of a display panel according to an embodiment.

FIG. 20 is a schematic cross-sectional view of a display panel 10 according to an embodiment. Referring to FIG. 20, a first sub-pixel Pm is arranged in a main display area MDA, and a second sub-pixel Pa is arranged in a component area CA. The component area may include a transmission area TA. A first pixel circuit PCm including a thin-film transistor TFT and a capacitor Cst, and a first organic light-emitting diode OLED as a display element connected to the first pixel circuit PCm may be arranged in the main display area MDA. A second organic light-emitting diode OLED' may be arranged in the component area CA. A second pixel circuit PCa connected to the second organic light-emitting diode OLED', and including a thin-film transistor TFT and a capacitor Cst may be arranged in the peripheral area DPA. On the other hand, a connection line TWL connecting the second pixel circuit PCa to the second organic light-emitting diode OLED' may be arranged in the component area CA and the peripheral area DPA.

In the present embodiment, an example in which the organic light-emitting diode is employed as the display element is given, but in another embodiment, an inorganic light-emitting element or a quantum dot light-emitting element may be employed as the display element.

Hereinafter, a structure in which elements included in the display panel 10 are stacked will be described. The display panel 10 may include a substrate 100, a buffer layer 111, a circuit layer PCL, and a display element layer EDL which are sequentially stacked.

The substrate 100 may include an insulating material such as glass, quartz, or a polymer resin. The substrate 100 may include a rigid substrate or a flexible substrate that is bendable, foldable, or rollable.

The buffer layer 111 may be disposed on the substrate 100, may reduce or prevent infiltration of foreign material, moisture, or ambient air from below the substrate 100, and may provide a flat surface on the substrate 100. The buffer layer 111 may include an inorganic material such as an oxide or a nitride, an organic material, or an organic/inorganic composite material, and may have a single-layer or multi-layer structure including an inorganic material and an organic material. A barrier layer (not illustrated) that blocks infiltration of ambient air may be further included between the substrate 100 and the buffer layer 111. According to some embodiments, the buffer layer 111 may include silicon oxide ($SiO_2$) or silicon nitride ($SiN_x$).

The circuit layer PCL may be disposed on the buffer layer 111, and may include first and second pixel circuits PCm and PCa, a first gate insulating layer 112, a first interlayer insulating layer 113, a second interlayer insulating layer 115, and a planarization layer 117.

A main thin-film transistor TFT may be disposed on the buffer layer 111. The thin-film transistor TFT may include a semiconductor layer A1, a gate electrode G1, a source electrode S1, and a drain electrode D1. The thin-film transistor TFT of the first pixel circuit PCm may be connected to a first organic light-emitting diode OLED and drive the first organic light-emitting diode OLED. The thin-film transistor TFT of the second pixel circuit PCa may be connected to a second organic light-emitting diode OLED' and drive the second organic light-emitting diode OLED'.

The semiconductor layer A1 may be disposed on the buffer layer 111 and may include polysilicon. In another embodiment, the semiconductor layer A1 may include amorphous silicon. In another embodiment, the semiconductor layer A1 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer A1 may include a channel region, and a source region and a drain region doped with impurities.

A first gate insulating layer 112 may cover the semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first gate insulating layer 112 may include a single layer or multiple layers including the above-described inorganic insulating material.

The gate electrode G1 may be arranged on the first gate insulating layer 112 to overlap the semiconductor layer A1. The gate electrode G1 may include molybdenum (Mo), aluminum (Al), copper (Cu), titanium (Ti), and the like, and may include a single layer or multiple layers. For example, the gate electrode G1 may include a single Mo layer.

The first interlayer insulating layer 113 may be arranged to cover the gate electrode G1. The first interlayer insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The first interlayer insulating layer 113 may include a single layer or multiple layers including the above-described inorganic insulating material.

An upper electrode CE2 of the capacitor Cst may be disposed on the first interlayer insulating layer 113. The upper electrode CE2 of the capacitor Cst may overlap the gate electrode G1 disposed therebelow. The gate electrode G1 and the upper electrode CE2 overlapping each other with the first interlayer insulating layer 113 disposed therebetween may constitute the capacitor Cst. The gate electrode G1 may be a lower electrode CE1 of the capacitor Cst.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The second interlayer insulating layer 115 may cover the upper electrode CE2. The second interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). The second interlayer insulating layer 115 may include a single layer or multiple layers including the above-described inorganic insulating material.

The source electrode S1 and the drain electrode D1 may disposed on the second interlayer insulating layer 115. The source electrode S1 and the drain electrode D1 may include a conductive material including molybdenum (Mo), aluminum (Al), copper (Cu), titanium (Ti), and the like, and may include a single layer or multiple layers including the above-described conductive material. For example, the source electrode S1 and the drain electrode D1 may have a multilayer structure of Ti/Al/Ti.

A connection line TWL connected to the second pixel circuit PCa may be disposed on the second interlayer insulating layer 115. The connection line TWL may extend from the peripheral area DPA to the component area CA and connect the second organic light-emitting diode OLED' to the second pixel circuit PCa. Also, a main data line DLm and an auxiliary data line DLa may be disposed on the second interlayer insulating layer 115.

The connection line TWL may include a first connection line TWL1 and a second connection line TWL2. The first connection line TWL1 may be arranged in the peripheral area DPA and connected to the thin-film transistor TFT of the second pixel circuit PCa. The second connection line TWL2 may be connected to the first connection line TWL1 and may be arranged in the transmission area TA of the component area CA. The second connection line TWL2 may be disposed on the same layer as the first connection line TWL1, and may include a material different from that of the first connection line TWL1. The end of the second connection line TWL2 may cover the end of the first connection line TWL1. In another embodiment, the second connection line TWL2 may be disposed on a layer different from the first connection line TWL1 and may be connected through a contact hole.

The first connection line TWL1 may include a conductive material including molybdenum (Mo), aluminum (Al), copper (Cu), titanium (Ti), and the like, and may include a single layer or multiple layers including the above-described material.

In FIG. 20, the first connection line TWL1 and the second connection line TWL2 are disposed on the second interlayer insulating layer 115, but the disclosure is not limited thereto. For example, the first connection line TWL1 may be disposed on the same layer as the upper electrode CE2 or the lower electrode CE1 of the capacitor Cst, or may be disposed on the same layer as the pixel electrode 121. The second connection line TWL2 may be disposed on the same layer as the upper electrode CE2 or the lower electrode CE1 of the capacitor Cst, or may be disposed between a first planarization layer 117a and a second planarization layer 117b.

The planarization layer 117 may be arranged to cover the source electrodes S1 and S2, the drain electrodes D1 and D2, and the connection line TWL. The planarization layer 117 may have a flat upper surface so that the first pixel electrode 121 and the second pixel electrode 121' disposed thereon may be formed to be flat.

The planarization layer 117 may include an organic material or an inorganic material, and may have a single-layer structure or a multilayer structure. The planarization layer 117 may include a first planarization layer 117a and a second planarization layer 117b. Therefore, a conductive pattern such as a line may be disposed between the first planarization layer 117a and the second planarization layer 117b, which may be advantageous for high integration. Connection electrodes CM and CM' and data connection lines DWL may be disposed on the first planarization layer 117a.

The planarization layer 117 may include a general-purpose polymer (e.g., benzocyclobutene (BCB), polyimide, hexamethyldisiloxane (HMDSO), polymethylmethacrylate (PMMA), or polystyrene (PS)), a polymer derivative having a phenol-based group, an acrylic polymer, an imide-based polymer, an aryl ether-based polymer, an amide-based polymer, a fluorine-based polymer, a p-xylene-based polymer, or a vinyl alcohol-based polymer. On the other hand, the planarization layer 117 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide (ZnO). After the planarization layer 117 is formed, chemical mechanical polishing may be performed on the upper surface thereof so as to provide the flat upper surface.

The first planarization layer 117a may be arranged to cover the first and second pixel circuits PCm and PCa. The second planarization layer 117b may be disposed on the first planarization layer 117a and may have a flat upper surface.

First and second organic light-emitting diodes OLED and OLED' are disposed on the second planarization layer 117b. First and second pixel electrodes 121 and 121' of the first and second organic light-emitting diodes OLED and OLED' may be connected to the first and second pixel circuits PCm and PCa through the connection electrodes CM and CM' arranged on the first planarization layer 117a.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure including layers including ITO, IZO, ZnO, or $In_2O_3$ above and/or below the reflective layer. In this case, the first pixel electrode 121 and the second pixel electrode 121' may have a structure in which ITO/Ag/ITO are stacked.

A pixel defining layer 119 may be disposed on the planarization layer 117, may cover the edges of the first pixel electrode 121 and the second pixel electrode 121', and may include a first opening OP1 and a second opening OP2 exposing a portion of the first pixel electrode 121 and a portion of the second pixel electrode 121', respectively. The sizes and shapes of emission areas of the first and second organic light-emitting diodes OLED and OLED', that is, the first and second sub-pixels Pm and Pa, may be defined by the first opening OP1 and the second opening OP2.

The pixel defining layer 119 may be formed through spin coating or the like by using an organic insulating material such as polyimide, polyamide, acrylic resin, benzocyclobutene, hexamethyldisiloxane (HMDSO), and phenol resin.

A first emission layer 122b and a second emission layer 122b' corresponding to the first pixel electrode 121 and the second pixel electrode 121', respectively, may be arranged in the first opening OP1 and the second opening OP2 of the pixel defining layer 119. The first emission layer 122b and the second emission layer 122b' may include a high molecular weight material or a low molecular weight material, and may emit red light, green light, blue light, or white light.

An organic functional layer 122e may be disposed above and/or below the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be disposed below the first emission layer 122b and the second emission layer 122b'. The first functional layer 122a may include a single layer or multiple layers including an organic material. The first functional layer 122a may include a hole transport layer (HTL) having a single-layer structure. Alternatively, the first functional layer 122a may include a hole injection layer (HIL) and a hole transport layer (HTL). The first functional layer 122a may be integrally formed to correspond to the first and second organic light-emitting diodes OLED and OLED' included in the main display area MDA and the component area CA.

The second functional layer 122c may be disposed above the first emission layer 122b and the second emission layer 122b'. The second functional layer 122c may include a single layer or multiple layers including an organic material. The second functional layer 122c may include an electron transport layer (ETL) and/or an electron injection layer (EIL). The second functional layer 122c may be integrally formed to correspond to the first and second organic light-emitting diodes OLED and OLED' included in the main display area MDA and the component area CA.

An opposite electrode 123 may be disposed on the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer such as ITO, IZO, ZnO, or $In_2O_3$ on the (semi) transparent layer including the above-described material. The opposite electrode 123 may be integrally formed to correspond to the first and second organic light-emitting diodes OLED and OLED' included in the main display area MDA and the component area CA.

Layers from the first pixel electrode 121 to the opposite electrode 123 in the main display area MDA may constitute the first organic light-emitting diode OLED. Layers from the second pixel electrode 121' to the opposite electrode 123 in the component area CA may constitute the second organic light-emitting diode OLED'.

An upper layer 150 including an organic material may be disposed on the opposite electrode 123. The upper layer 150 may be a layer provided to protect the opposite electrode 123 and increase light extraction efficiency. The upper layer 150 may include an organic material having a refractive index higher than that of the opposite electrode 123. Alternatively, the upper layer 150 may be provided by stacking layers having different refractive indices from each other. For example, the upper layer 150 may be provided by stacking a high refractive index layer, a low refractive index layer, and a high refractive index layer. In this case, the refractive index of the high refractive index layer may be about 1.7 or more, and the refractive index of the low refractive index layer may be about 1.3 or less.

The upper layer 150 may further include LiF. Alternatively, the upper layer 150 may further include an inorganic insulating material such as silicon oxide ($SiO_2$) and silicon nitride ($SiN_x$).

As described above, in the display panel and the display device according to one or more embodiments, because the pixel circuit is not arranged in the component area, a wider transmission area may be secured and transmittance may be improved. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device including a display area and a non-display area, the display area including a first area and a second area having a resolution lower than the first area, and the non-display area including a third area which is a peripheral area surrounding the first area and the second area, the display device comprising:
a substrate;
first display elements arranged in the first area on the substrate;
first pixel circuits arranged in the first area on the substrate and connected to the first display elements;
second display elements arranged in the second area on the substrate; and
second pixel circuits arranged in the third area on the substrate and connected to the second display elements,
wherein the second pixel circuits connected to the second display elements arranged in a column are arranged in a plurality of columns in the third area.

2. The display device of claim 1, wherein the second pixel circuits connected to the second display elements arranged in the column are arranged in two columns in the third area.

3. The display device of claim 2, wherein the second pixel circuits connected to the second display elements arranged in the column are sequentially and alternately arranged in a left circuit column and a right circuit column, and a pair of second pixel circuits connected to a pair of second display elements adjacent to each other are arranged in a same circuit column.

4. The display device of claim 2, wherein the second display elements arranged in the column comprise second display elements emitting light of a first color.

5. The display device of claim 2, wherein the second display elements arranged in the column comprise second display elements emitting light of a second color and second display elements emitting light of a third color, and the second display elements emitting the light of the second color and the second display elements emitting the light of the third color are alternately arranged in the column.

6. The display device of claim 1, further comprising connection lines connecting the second display elements to the second pixel circuits.

7. The display device of claim 6, wherein the connection lines comprise first connection lines arranged in the third area and connected to the second pixel circuits, and second connection lines arranged in the second area and connecting the first connection lines to the second display elements.

8. The display device of claim 7, wherein each of the second connection lines is connected to a pixel electrode constituting the second display element.

9. The display device of claim 1, further comprising:
main scan lines arranged in the first area and connected to the first pixel circuits; and
auxiliary scan lines arranged in the second area and connected to the second pixel circuits.

10. The display device of claim 9, wherein a second scan signal is applied to one of the auxiliary scan lines at a timing when a first scan signal is applied to main scan lines of (7k+1)th rows (where k is a natural number) among the main scan lines.

11. The display device of claim 1, further comprising:
main data lines arranged in the first area and connected to the first pixel circuits;
auxiliary data lines arranged in the second area and connected to the second pixel circuits; and
data connection lines arranged in the first area and connecting the main data lines to the auxiliary data lines, respectively.

12. A display device comprising:
a substrate comprising a first area, a second area having a resolution lower than the first area, and a third area:
first sub-pixels arranged in the first area on the substrate;
first pixel circuits arranged in the first area on the substrate and connected to the first sub-pixels;
second sub-pixels arranged in the second area on the substrate; and second pixel circuits arranged in the third area on the substrate and connected to the second sub-pixels, wherein the second sub-pixels comprise first color sub-pixels arranged in a first pixel column, and second color sub-pixels and third color sub-pixels alternately arranged in a second pixel column, wherein second pixel circuits connected to the first color sub-pixels arranged in the first pixel column are arranged in two circuit columns in the third area, and wherein second pixel circuits connected to the second color sub-pixels and the third color sub-pixels arranged in the second pixel column are arranged in two circuit columns in the third area.

13. The display device of claim 12, wherein second pixel circuits connected to the second sub-pixels in each of the first pixel column and the second pixel column are sequentially and alternately arranged in a left circuit column and a right circuit column, and a pair of second pixel circuits connected to a pair of second sub-pixels adjacent to each other are arranged in a same circuit column.

14. The display device of claim 12, further comprising connection lines connecting the second sub-pixels to the second pixel circuits.

15. The display device of claim 14, wherein the connection lines comprise first connection lines arranged in the third area and connected to the second pixel circuits, and second connection lines arranged in the second area and connecting the first connection lines to the second sub-pixels.

16. The display device of claim 12, further comprising:
main scan lines arranged in the first area and connected to the first pixel circuits; and
auxiliary scan lines arranged in the second area and connected to the second pixel circuits.

17. The display device of claim 16, wherein a second scan signal is applied to one of the auxiliary scan lines at a timing when a first scan signal is applied to main scan lines of (7k+1)th rows (where k is a natural number) among the main scan lines.

18. The display device of claim 17, further comprising:
a first scan driver arranged in the third area and connected to the main scan lines and configured to apply a plurality of first scan signals to the main scan lines; and
a second scan driver arranged in the third area and connected to the auxiliary scan lines and configured to apply a plurality of second scan signals to the auxiliary scan lines.

19. The display device of claim 16, wherein second pixel circuits connected to second sub-pixels including a pair of first color sub-pixels in the first pixel column and a second color sub-pixel and a third color sub-pixel in the second pixel column are connected to a same auxiliary scan line.

20. The display device of claim 12, further comprising:
main data lines arranged in the first area and connected to the first pixel circuits;
auxiliary data lines arranged in the second area and connected to the second pixel circuits; and
data connection lines arranged in the first area and connecting the main data lines to the auxiliary data lines, respectively.

* * * * *